US009300062B2

(12) United States Patent
Hussell et al.

(10) Patent No.: US 9,300,062 B2
(45) Date of Patent: Mar. 29, 2016

(54) ATTACHMENT DEVICES AND METHODS FOR LIGHT EMITTING DEVICES

(75) Inventors: Christopher P. Hussell, Cary, NC (US); Kurt S. Wilcox, Libertyville, IL (US); Peter Scott Andrews, Durham, NC (US); Jesse Colin Reiherzer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 249 days.

(21) Appl. No.: 13/282,172

(22) Filed: Oct. 26, 2011

(65) Prior Publication Data
US 2012/0250310 A1    Oct. 4, 2012

Related U.S. Application Data

(60) Provisional application No. 61/416,184, filed on Nov. 22, 2010.

(51) Int. Cl.
*H01R 12/57* (2011.01)
*H01R 12/51* (2011.01)
*H01L 25/075* (2006.01)
*H01L 33/62* (2010.01)

(52) U.S. Cl.
CPC .......... *H01R 12/515* (2013.01); *H01L 25/0753* (2013.01); *H01L 33/62* (2013.01); *H01L 2224/45139* (2013.01); *H01L 2224/48137* (2013.01); *H01L 2924/09701* (2013.01); *H01R 12/57* (2013.01); *Y10T 29/49002* (2015.01)

(58) Field of Classification Search
CPC ....... H01R 13/40; H01R 12/57; H01R 12/515
USPC ............... 439/56, 62, 78, 81, 83, 84
See application file for complete search history.

(56) References Cited

U.S. PATENT DOCUMENTS

| 34,861 A | 4/1862 | Knowlton et al. |
| 4,855,194 A | 8/1989 | Wright |
| 4,946,547 A | 8/1990 | Palmour |
| 5,200,022 A | 4/1993 | Kong |
| 5,210,051 A * | 5/1993 | Carter, Jr. ........................ 438/22 |
| RE34,861 E | 2/1995 | Davis et al. |
| 5,393,993 A * | 2/1995 | Edmond et al. .................. 257/77 |

(Continued)

FOREIGN PATENT DOCUMENTS

| CN | 101438630 A | 5/2009 |
| CN | 101636887 | 1/2010 |

(Continued)

OTHER PUBLICATIONS

Taiwanese Search Report for Application No. 102301394 dated Jul. 9, 2013.

(Continued)

*Primary Examiner* — James Harvey
(74) *Attorney, Agent, or Firm* — Jenkins, Wilson, Taylor & Hunt, P.A.

(57) ABSTRACT

Attachment devices and methods for use with light emitting devices are provided. In one aspect, the light emitting device can include a submount and a light emission area disposed over the submount. The device can further include at least one attachment member provided on the submount. The attachment member can engage an electrical component thereby providing a gas-tight, solder free connection between the attachment member and electrical component.

69 Claims, 13 Drawing Sheets

(56) References Cited

U.S. PATENT DOCUMENTS

| | | | |
|---|---|---|---|
| 5,523,589 A * | 6/1996 | Edmond et al. ............. | 257/77 |
| 6,093,053 A * | 7/2000 | Horioka et al. ............. | 439/444 |
| 6,224,430 B1 * | 5/2001 | Kusuda et al. ............. | 439/709 |
| 6,503,780 B1 | 1/2003 | Glenn et al. | |
| 6,548,832 B1 | 4/2003 | Sakamoto et al. | |
| 6,909,051 B2 * | 6/2005 | Noble ........................ | 174/251 |
| 7,034,778 B1 | 4/2006 | Hähl | |
| 7,055,987 B2 | 6/2006 | Staufert | |
| D528,672 S | 9/2006 | Nagai | |
| D528,996 S | 9/2006 | Egawa | |
| 7,208,838 B2 | 4/2007 | Masuda | |
| D541,761 S | 5/2007 | Saito et al. | |
| 7,213,940 B1 | 5/2007 | Van de Ven et al. | |
| 7,224,000 B2 | 5/2007 | Aanegola et al. | |
| D570,506 S | 6/2008 | Uemoto | |
| D570,797 S | 6/2008 | Song | |
| D573,553 S | 7/2008 | Uemoto et al. | |
| D573,731 S | 7/2008 | Uemoto | |
| 7,393,237 B2 * | 7/2008 | Kuo ........................... | 439/490 |
| D576,576 S | 9/2008 | Shida et al. | |
| 7,479,660 B2 | 1/2009 | Kobilke | |
| 7,482,636 B2 | 1/2009 | Murayama et al. | |
| D586,303 S | 2/2009 | Fuwa et al. | |
| D589,470 S | 3/2009 | Chen | |
| D591,248 S | 4/2009 | Imai et al. | |
| D592,615 S | 5/2009 | Imai et al. | |
| D593,043 S | 5/2009 | Song | |
| D602,451 S | 10/2009 | Gielen | |
| D603,813 S | 11/2009 | Nishimura et al. | |
| D607,420 S | 1/2010 | Imai et al. | |
| 7,649,209 B2 | 1/2010 | Hussell et al. | |
| 7,655,954 B2 | 2/2010 | Wang et al. | |
| D615,051 S | 5/2010 | Chen et al. | |
| D615,052 S | 5/2010 | Imai et al. | |
| D618,635 S | 6/2010 | Imai et al. | |
| D622,876 S | 8/2010 | Takahashi et al. | |
| 7,780,313 B2 | 8/2010 | Lam et al. | |
| 7,804,147 B2 | 9/2010 | Tarsa et al. | |
| 7,812,365 B2 | 10/2010 | Murayama | |
| 7,825,578 B2 | 11/2010 | Takashima et al. | |
| D630,171 S | 1/2011 | Hsieh | |
| 7,872,418 B2 | 1/2011 | Hata et al. | |
| D636,899 S | 4/2011 | Shibahara | |
| D637,564 S | 5/2011 | Tseng et al. | |
| 7,943,952 B2 | 5/2011 | Loh et al. | |
| 7,955,147 B1 * | 6/2011 | Legrady et al. ............. | 439/877 |
| D640,997 S | 7/2011 | Imai et al. | |
| 7,994,518 B2 | 8/2011 | Wang et al. | |
| D645,417 S | 9/2011 | Imai et al. | |
| 8,022,626 B2 | 9/2011 | Hamby et al. | |
| 8,044,418 B2 | 10/2011 | Loh et al. | |
| 8,058,088 B2 | 11/2011 | Cannon | |
| D650,760 S | 12/2011 | Hussell et al. | |
| 8,119,534 B2 | 2/2012 | Tanaka et al. | |
| D658,601 S | 5/2012 | Egawa et al. | |
| D658,602 S | 5/2012 | Egawa et al. | |
| D658,603 S | 5/2012 | Egawa et al. | |
| 8,167,674 B2 | 5/2012 | Hussell et al. | |
| D667,803 S | 9/2012 | Hussell et al. | |
| D669,041 S | 10/2012 | Imai et al. | |
| 8,354,684 B2 | 1/2013 | West | |
| D676,000 S | 2/2013 | Hussell et al. | |
| D676,395 S | 2/2013 | Hussell et al. | |
| 8,410,679 B2 | 4/2013 | Ibbetson et al. | |
| 8,425,271 B2 | 4/2013 | Hussell et al. | |
| D683,708 S | 6/2013 | Sasano et al. | |
| 8,455,908 B2 | 6/2013 | Welch et al. | |
| 8,461,613 B2 | 6/2013 | Chou et al. | |
| 8,517,572 B2 | 8/2013 | Ferenc | |
| D689,451 S | 9/2013 | Shimonishi et al. | |
| 8,563,339 B2 | 10/2013 | Tarsa | |
| 8,564,000 B2 | 10/2013 | Hussell | |
| 8,575,639 B2 | 11/2013 | Hussell | |
| 8,624,271 B2 | 1/2014 | Reiherzer | |
| D702,653 S | 4/2014 | Wilcox et al. | |
| D705,181 S | 5/2014 | Hussell et al. | |
| 8,729,589 B2 | 5/2014 | Hussell et al. | |
| 8,733,968 B2 | 5/2014 | Van De Ven et al. | |
| D706,231 S | 6/2014 | Hussell et al. | |
| D707,192 S | 6/2014 | Hussell et al. | |
| 8,809,880 B2 | 8/2014 | Hussell | |
| D712,850 S | 9/2014 | Welch et al. | |
| 8,921,869 B2 | 12/2014 | Welch et al. | |
| D721,339 S | 1/2015 | Hussell et al. | |
| 8,994,057 B2 | 3/2015 | Hussell | |
| 9,000,470 B2 | 4/2015 | Tudorica | |
| D736,725 S | 8/2015 | Wilcox et al. | |
| D739,565 S | 9/2015 | Welch et al. | |
| D740,453 S | 10/2015 | Welch et al. | |
| 2004/0079957 A1 | 4/2004 | Andrews et al. | |
| 2004/0169466 A1 | 9/2004 | Suehiro et al. | |
| 2004/0196663 A1 | 10/2004 | Ishida et al. | |
| 2005/0073244 A1 | 4/2005 | Chou et al. | |
| 2005/0152145 A1 | 7/2005 | Currie et al. | |
| 2005/0199899 A1 | 9/2005 | Lin et al. | |
| 2005/0264172 A1 | 12/2005 | Wojnarowski et al. | |
| 2006/0139595 A1 | 6/2006 | Koenen et al. | |
| 2006/0147746 A1 | 7/2006 | Wakako et al. | |
| 2006/0180818 A1 | 8/2006 | Nagai et al. | |
| 2006/0186418 A1 | 8/2006 | Edmond | |
| 2007/0018295 A1 | 1/2007 | Kim et al. | |
| 2007/0029569 A1 | 2/2007 | Andrews | |
| 2007/0057364 A1 | 3/2007 | Wang et al. | |
| 2007/0131954 A1 | 6/2007 | Murayama et al. | |
| 2007/0158668 A1 | 7/2007 | Tarsa | |
| 2007/0194336 A1 | 8/2007 | Shin et al. | |
| 2007/0247855 A1 | 10/2007 | Yano | |
| 2007/0252523 A1 | 11/2007 | Maeda et al. | |
| 2007/0253209 A1 | 11/2007 | Loh et al. | |
| 2008/0019130 A1 | 1/2008 | Wang | |
| 2008/0026498 A1 | 1/2008 | Tarsa et al. | |
| 2008/0054279 A1 | 3/2008 | Hussell et al. | |
| 2008/0054284 A1 | 3/2008 | Hussell et al. | |
| 2008/0054286 A1 | 3/2008 | Loh et al. | |
| 2008/0078664 A1 | 4/2008 | Schmidt et al. | |
| 2008/0079017 A1 | 4/2008 | Loh et al. | |
| 2008/0089072 A1 | 4/2008 | Kim et al. | |
| 2008/0106723 A1 | 5/2008 | Hoogendam et al. | |
| 2008/0153344 A1 * | 6/2008 | Horst et al. .................. | 439/427 |
| 2008/0164484 A1 | 7/2008 | Lee | |
| 2008/0173884 A1 | 7/2008 | Chitnis | |
| 2008/0179611 A1 | 7/2008 | Chitnis | |
| 2008/0219003 A1 | 9/2008 | Park | |
| 2008/0224166 A1 | 9/2008 | Glovatsky et al. | |
| 2008/0239318 A1 | 10/2008 | Den Boef et al. | |
| 2008/0258130 A1 | 10/2008 | Bergmann | |
| 2009/0009103 A1 * | 1/2009 | McKechnie .................. | 315/291 |
| 2009/0023323 A1 * | 1/2009 | Lin et al. ...................... | 439/345 |
| 2009/0122514 A1 | 5/2009 | Yoon et al. | |
| 2009/0130889 A1 * | 5/2009 | Daily et al. ................... | 439/345 |
| 2009/0166657 A1 | 7/2009 | Yamada et al. | |
| 2009/0239409 A1 * | 9/2009 | Bishop ........................ | 439/404 |
| 2009/0261374 A1 | 10/2009 | Hayashi | |
| 2009/0262527 A1 | 10/2009 | Chou | |
| 2009/0289169 A1 | 11/2009 | Yang et al. | |
| 2009/0315061 A1 | 12/2009 | Andrews | |
| 2009/0322197 A1 | 12/2009 | Helbing | |
| 2010/0078664 A1 | 4/2010 | Helbing | |
| 2010/0096642 A1 | 4/2010 | Chang et al. | |
| 2010/0103660 A1 | 4/2010 | Van de Ven et al. | |
| 2010/0139836 A1 | 6/2010 | Horikoshi | |
| 2010/0141182 A1 | 6/2010 | Shi | |
| 2010/0155763 A1 | 6/2010 | Donofrio | |
| 2010/0193822 A1 | 8/2010 | Inobe et al. | |
| 2010/0252851 A1 | 10/2010 | Emerson et al. | |
| 2010/0253248 A1 | 10/2010 | Shi | |
| 2010/0264799 A1 | 10/2010 | Liu et al. | |
| 2010/0270567 A1 | 10/2010 | Emerson et al. | |
| 2010/0320483 A1 | 12/2010 | Kadotani et al. | |
| 2011/0012143 A1 | 1/2011 | Yuan et al. | |
| 2011/0013400 A1 * | 1/2011 | Kanno et al. ............. | 362/296.01 |
| 2011/0043137 A1 | 2/2011 | Negley et al. | |
| 2011/0065241 A1 | 3/2011 | Lin et al. | |
| 2011/0068674 A1 | 3/2011 | Takenaka et al. | |

(56) References Cited

U.S. PATENT DOCUMENTS

| | | | |
|---|---|---|---|
| 2011/0068696 A1 | 3/2011 | Van de Ven et al. | |
| 2011/0068702 A1 | 3/2011 | Van de Ven et al. | |
| 2011/0116275 A1* | 5/2011 | Sheek | 362/382 |
| 2011/0121323 A1 | 5/2011 | Wu et al. | |
| 2011/0127912 A1 | 6/2011 | Lee et al. | |
| 2011/0128730 A1 | 6/2011 | Chiu | |
| 2011/0136394 A1* | 6/2011 | Mostoller et al. | 439/701 |
| 2011/0148327 A1 | 6/2011 | Van De Ven et al. | |
| 2011/0176316 A1 | 7/2011 | Phipps et al. | |
| 2011/0221330 A1 | 9/2011 | Negley et al. | |
| 2011/0291151 A1 | 12/2011 | Matsuda et al. | |
| 2012/0126255 A1 | 5/2012 | Hussell et al. | |
| 2012/0126257 A1 | 5/2012 | Reiherzer et al. | |
| 2012/0175643 A1 | 7/2012 | West | |
| 2012/0193651 A1 | 8/2012 | Edmond | |
| 2012/0205689 A1 | 8/2012 | Welch | |
| 2012/0241807 A1 | 9/2012 | Hoetzl et al. | |
| 2012/0250310 A1* | 10/2012 | Hussell et al. | 362/235 |
| 2012/0299022 A1 | 11/2012 | Hussell | |
| 2013/0058099 A1 | 3/2013 | Shum et al. | |
| 2013/0207130 A1 | 8/2013 | Reiherzer | |
| 2013/0207142 A1 | 8/2013 | Reiherzer | |
| 2014/0097453 A1 | 4/2014 | Hussell et al. | |
| 2014/0097454 A1 | 4/2014 | Hussell | |
| 2014/0183577 A1 | 7/2014 | Hussell et al. | |
| 2014/0217433 A1 | 8/2014 | Tudorica et al. | |
| 2014/0240974 A1 | 8/2014 | Hussell et al. | |
| 2015/0207040 A1 | 7/2015 | Hussell | |

FOREIGN PATENT DOCUMENTS

| | | |
|---|---|---|
| CN | 101876406 | 11/2010 |
| CN | 102044602 | 5/2011 |
| CN | ZL 2011-30139847.5 | 8/2012 |
| CN | ZL 2011-30166527.9 | 8/2012 |
| CN | ZL201230099913.5 | 11/2012 |
| CN | ZL201230099954.4 | 12/2012 |
| CN | ZL201230099981.1 | 12/2012 |
| CN | ZL 201230472866.4 | 5/2013 |
| CN | ZL201230130915.6 | 10/2013 |
| CN | ZL201230652790.3 | 10/2013 |
| CN | ZL201230652789.0 | 11/2013 |
| CN | ZL201230652840.8 | 11/2013 |
| CN | ZL201330361367.2 | 1/2014 |
| EP | 1640792 | 3/2006 |
| EP | 1 670 073 | 6/2006 |
| EP | 2 302 283 | 3/2011 |
| EP | 2 302 286 | 3/2011 |
| EP | 2327930 | 6/2011 |
| EP | 2 560 219 A1 | 2/2013 |
| EP | 2 643 861 | 10/2013 |
| EP | 2 643 862 | 10/2013 |
| EP | 2751471 | 7/2014 |
| FR | 2 921 537 | 9/2007 |
| JP | 10-311937 | 11/1998 |
| JP | 2001-294083 | 10/2001 |
| JP | 2003-192442 | 7/2003 |
| JP | 2003-305504 | 10/2003 |
| JP | 2004-228413 | 8/2004 |
| JP | 2004-311948 A | 11/2004 |
| JP | 2005-183148 | 7/2005 |
| JP | 2005-266117 | 9/2005 |
| JP | 2005-276979 | 10/2005 |
| JP | 2006/066786 | 3/2006 |
| JP | 2006-294898 | 10/2006 |
| JP | 2007-227680 | 9/2007 |
| JP | 2007-266357 | 10/2007 |
| JP | 2007-323857 | 12/2007 |
| JP | 2007-335371 | 12/2007 |
| JP | 2008-244075 | 10/2008 |
| JP | 2009-503888 | 1/2009 |
| JP | 2009-044055 | 2/2009 |
| JP | 2009-289918 | 12/2009 |
| JP | 2010-009972 | 1/2010 |
| JP | 2010103541 | 5/2010 |
| JP | 2010-147189 | 7/2010 |
| JP | 2010192109 A | 9/2010 |
| JP | 2011-108744 | 10/2010 |
| JP | 2011-228369 | 11/2011 |
| JP | 2012-503331 | 2/2012 |
| JP | 2012-079855 | 4/2012 |
| JP | 1461828 | 2/2013 |
| JP | 1476166 | 7/2013 |
| JP | 1476175 | 7/2013 |
| JP | 1493219 | 2/2014 |
| KR | 10-0793338 | 1/2008 |
| KR | 10-2008-0033496 | 4/2008 |
| KR | 10-2008-0092239 | 10/2008 |
| KR | 10-2009-0011121 | 3/2009 |
| KR | 10-2010-0111255 | 10/2010 |
| KR | 10-2011-0021639 | 3/2011 |
| KR | DES 30-0753131 | 7/2014 |
| KR | DES 30-0753132 | 7/2014 |
| TW | 540169 | 7/2003 |
| TW | 113260 | 10/2006 |
| TW | 124444 | 8/2008 |
| TW | 201029146 | 8/2010 |
| TW | D141645 | 7/2011 |
| TW | D144159 | 12/2011 |
| TW | D156539 | 10/2013 |
| TW | D159325 | 3/2014 |
| TW | D159326 | 3/2014 |
| TW | D159849 | 4/2014 |
| TW | D159850 | 4/2014 |
| TW | D159851 | 4/2014 |
| TW | D160508 | 5/2014 |
| TW | D160509 | 5/2014 |
| TW | D160580 | 5/2014 |
| TW | D160581 | 5/2014 |
| TW | D160850 | 6/2014 |
| TW | I502772 | 10/2015 |
| WO | WO 2008/069204 | 6/2008 |
| WO | WO 2009/133615 | 11/2009 |
| WO | WO 2009/141982 | 11/2009 |
| WO | WO 2011/129203 | 10/2011 |
| WO | WO 2010/029360 | 3/2012 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |
| WO | WO 2013/070696 | 5/2013 |
| WO | WO 2013/096431 | 6/2013 |
| WO | WO 2013/122831 | 8/2013 |

OTHER PUBLICATIONS

Taiwanese Office Action for Application No. 102301394 dated Jul. 15, 2013.
Chinese Notice of Grant for Application No. 201230652840.8 dated Jul. 26, 2013.
Ex Parte Quayle Action for U.S. Appl. No. 13/671,089 dated Aug. 13, 2013.
Korean Office Action for Application No. 30-2012-0020196 dated Aug. 13, 2013.
Korean Office Action for Application No. 30-2012-0020197 dated Aug. 13, 2013.
Korean Office Action for Application No. 30-2012-0020198 dated Aug. 13, 2013.
Notice of Allowance for U.S. Appl. No. 13/104,558 dated Aug. 28, 2013.
Non-Final Office Action for U.S. Appl. No. 13/224,850 dated Sep. 5, 2013.
Taiwanese Search Report for Application No. 102300059 dated Apr. 17, 2013.
Taiwanese Search Report for Application No. 102300058 dated Apr. 29, 2013.
Taiwanese Office Action for Application No. 102301581 dated Sep. 6, 2013.
Taiwanese Office Action for Application No. 102301582 dated Sep. 6, 2013.

(56) References Cited

OTHER PUBLICATIONS

Taiwanese Office Action for Application No. 102301583 dated Sep. 6, 2013.
Taiwanese Office Action for Application No. 102301584 dated Sep. 6, 2013.
Taiwanese Office Action for Application No. 102301585 dated Sep. 6, 2013.
Restriction Requirement for U.S. Appl. No. 13/793,882 dated Sep. 20, 2013.
Restriction Requirement for U.S. Appl. No. 29/417,220 dated Sep. 27, 2013.
Restriction Requirement for U.S. Appl. No. 29/451,177 dated Sep. 27, 2013.
Restriction Requirement for U.S. Appl. No. 29/425,831 dated Sep. 30, 2013.
Chinese Notice to Grant for Application No. 201330361367.2 dated Oct. 8, 2013.
Notice of Allowance for U.S. Appl. No. 13/671,089 dated Oct. 22, 2013.
Restriction Requirement for U.S. Appl. No. 29/412,166 dated Oct. 25, 2013.
Restriction Requirement for U.S. Appl. No. 29/412,168 dated Oct. 25, 2013.
Bridgelux Product Data Sheet —1 page.
Citizen Co. Product Data Sheet—4 pages http://ce.citizen.co.jp/lighting_led/en/products/index.html.
U.S. Appl. No. 29/379,636 for "Light Emitting Device Package", filed Nov. 22, 2010.
Design U.S. Appl. No. 29/380,387 for "Light Emitting Device Package" filed Dec. 3, 2010.
U.S. Appl. No. 13/028,972 for "Light Emitting Devices and Methods" filed Feb. 16, 2011.
U.S. Appl. No. 13/104,558 for "Light Emitting Devices and Methods" filed May 10, 2011.
Notice of Allowance for U.S. Appl. No. 29/379,636 dated Aug. 4, 2011.
U.S. Appl. No. 13/224,850 for "Light Emitting Device Component" filed Sep. 2, 2011.
Design U.S. Appl. No. 29/408,955 for "Light Emitting Device Package" filed Dec. 19, 2011.
Notification of Granting Patent Right for Design for Application Serial No. CN 2011/30166527.9 dated Apr. 6, 2012.
Non-Final Office Action for U.S. Appl. No. 29/380,387 dated Apr. 25, 2012.
Notification of Granting Patent Right for Design for Application Serial No. CN 2011/30139847.5 dated Apr. 26, 2012.
Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
U.S. Appl. No. 13/336,540 dated Dec. 23, 2011.
International Search Report and Written Opinion for Application Serial No. PCT/US2011/058596 dated Jun. 18, 2012.
Chinese Office Action for Application Serial No. CN 2012/30130915.6 dated Jul. 12, 2012.
Office Action/Restriction Requirement for U.S. Appl. No. 13/028,972 dated Jul. 25, 2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 17, 2012.
Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Non-Final Office Action for U.S. Appl. No. 13/028,972 dated Oct. 10, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for U.S. Appl. No. 13/104,558 dated Jan. 3, 2013.
Japanese Office Action for Application No. 2012-031548 dated Nov. 5, 2013.
Japanese Office Action for Application No. 2012-031549 dated Nov. 5, 2013.
Taiwanese Notice of Allowance for Application No. 102301394 dated Nov. 8, 2013.
Taiwanese Notice of Allowance for Application No. 102301395 dated Nov. 8, 2013.
Non-Final Office Action for U.S. Appl. No. 13/793,882 dated Nov. 15, 2013.
Notice of Allowance for U.S. Appl. No. 29/404,913 dated Nov. 27, 2013.
Taiwanese Notice of Allowance for Application No. 102301583 dated Dec. 17, 2013.
Taiwanese Notice of Allowance for Application No. 102301581 dated Dec. 17, 2013.
Taiwanese Notice of Allowance for Application No. 102301585 dated Dec. 17, 2013.
Notice of Allowance for U.S. Appl. No. 29/412,168 dated Dec. 20, 2013.
Non-Final Office Action for U.S. Appl. No. 29/425,831 dated Dec. 24, 2013.
Notice of Allowance for U.S. Appl. No. 29/412,166 dated Dec. 24, 2013.
Non-Final Office Action for U.S. Appl. No. 29/451,177 dated Dec. 30, 2013.
Notice of Allowance for U.S. Appl. No. 29/417,220 dated Jan. 10, 2014.
Taiwanese Office Action for Application No. 101302309 dated Jan. 23, 2013.
Chinese Decision to Grant for Application No. 201230472866.4 dated Jan. 24, 2013.
Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
Notice of Allowance for U.S. Appl. No. 13/028,972 dated Feb. 28, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Non-Final Office Action for U.S. Appl. No. 13/671,089 dated Mar. 29, 2013.
Notice of Allowance for U.S. Appl. No. 13/336,540 dated Jan. 31, 2013.
Restriction Requirement for U.S. Appl. No. 13/671,089 dated Feb. 7, 2013.
Restriction Requirement for U.S. Appl. No. 29/404,913 dated Feb. 15, 2013.
International Search Report and Written Opinion for Application No. PCT/US2012/070589 dated Apr. 22, 2013.
International Search Report and Written Opinion for Application No. PCT/US2013/025307 dated May 15, 2013.
Notice of Allowance for U.S. Appl. No. 13/028,972 dated May 23, 2013.
Japanese Office Action for Application No. 2012-031549 dated Jun. 4, 2013.

(56) References Cited

OTHER PUBLICATIONS

Japanese Decision of Registration for Application No. 2012-023963 dated Jun. 4, 2013.
Japanese Decision of Registration for Application No. 2012-026117 dated Jun. 4, 2013.
Taiwanese Notice of Allowance for Application No. 101302309 dated Jun. 5, 2013.
Notice of Allowance for U.S. Appl. No. 13/435,912 dated Jun. 19, 2013.
Notice of Allowance for U.S. Appl. No. 29/404,913 dated Jun. 25, 2013.
Chinese Notice of Grant for Application No. 201230652790.3 dated Jun. 26, 2013.
Notice of Allowance for U.S. Appl. No. 13/104,558 dated Jul. 1, 2013.
Chinese Notice of Grant for Application No. 201230130915.6 dated Jul. 3, 2013.
Chinese Decision to Grant for Application No. 201230652789 dated Jul. 17, 2013.
Taiwanese Office Action for Application No. 100141888 dated Mar. 11, 2014.
Notice of Allowance for U.S. Appl. No. 29/451,177 dated Apr. 25, 2014.
Restriction Requirement for U.S. Appl. No. 14/148,102 dated Apr. 24, 2014.
Korean Notice of Allowance for Application No. 30-2012-0020196 dated Apr. 21, 2014.
Korean Notice of Allowance for Application No. 30-2012-0020197 dated Apr. 21, 2014.
Final Office Action for U.S. Appl. No. 13/224,850 dated May 30, 2014.
Online definition of the term "non-linear", http://thefreedictionary.com/nonlinear, accessed on May 17, 2014.
Final Office Action for U.S. Appl. No. 29/425,831 dated Jun. 10, 2014.
Taiwanese Notice of Allowance for Application No. 102301582 dated Jan. 13, 2014.
Taiwanese Notice of Allowance for Application No. 102301584 dated Jan. 13, 2014.
Japanese Decision of Registration for Application No. 2013-018279 dated Jan. 15, 2014.
Taiwanese Notice of Allowance for Application No. 102300058 dated Jan. 17, 2014.
Taiwanese Notice of Allowance for Application No. 102300059 dated Jan. 17, 2014.
Korean Notice of Rejection for Application No. KR 30-2012-0020198 dated Jan. 14, 2014.
Taiwanese Notice of Allowance for Application No. 101307667 dated Feb. 7, 2014.
Supplemental Notice of Allowance for U.S. Appl. No. 29/404,913 dated Feb. 20, 2014.
Notice of Allowance for U.S. Appl. No. 13/793,882 dated Mar. 12, 2014.
Restriction Requirement for U.S. Appl. No. 14/043,494 dated Mar. 20, 2014.
Restriction Requirement for U.S. Appl. No. 13/908,597 dated Mar. 20, 2014.
Restriction Requirement for U.S. Appl. No. 14/052,201 dated Mar. 20, 2014.
Notice of Allowance for U.S. Appl. No. 14/052,201 dated Nov. 28, 2014.
Notice of Allowance for U.S. Appl. No. 14/168,561 dated Nov. 28, 2014.
Restriction Requirement for U.S. Appl. No. 29/452,692 dated Dec. 4, 2014.
Japanese Office Action for Application No. 2013-540955 dated Jan. 20, 2015.
Notice of Allowance for U.S. Appl. No. 14/189,500 dated Jan. 23, 2015.
Korean Decision to Decline Amendment and Decision of Rejection for Application No. 10-2013-7015669 dated Dec. 26, 2014.
Restriction Requirement for U.S. Appl. No. 29/459,233 dated Feb. 23, 2015.
Restriction Requirement for U.S. Appl. No. 29/459,231 dated Feb. 13, 2015.
Notice of Allowance for U.S. Appl. No. 29/487,954 dated Mar. 30, 2015.
Notice of Allowance for U.S. Appl. No. 14/043,494 dated Apr. 17, 2015.
Korean Office Action for Application No. 10-2013-7015669 dated Jun. 3, 2014.
European Notice of Publication for Application No. 12827778.7 dated Jun. 12, 2014.
Restriction Requirement for U.S. Appl. No. 13/836,709 dated Jun. 19, 2014.
Non-Final Office Action for U.S. Appl. No. 14/052,201 dated Jun. 19, 2014.
Non-Final Office Action for U.S. Appl. No. 14/043,494 dated Jun. 20, 2014.
Non-Final Office Action for U.S. Appl. No. 14/148,102 dated Jun. 20, 2014.
Restriction Requirement for U.S. Appl. No. 14/168,561 dated Jul. 1, 2014.
Korean Certificate of Design Patent for Application No. 2012-0020196 dated Jul. 14, 2014.
Korean Certificate of Design Patent for Application No. 2012-0020197 dated Jul. 14, 2014.
Non-Final Office Action for U.S. Appl. No. 14/189,500 dated Jul. 15, 2014.
Korean Trial Decision for Application No. 30-2012-0020198 dated Jul. 29, 2014.
Taiwanese Office Action for Application No. 100141889 dated Aug. 6, 2014.
Notice of Allowance for U.S. Appl. No. 13/908,597 dated Aug. 20, 2014.
European Patent Office Communication pursuant to Rule 114(2) EPC for Application No. 2011-0843773 dated Aug. 20, 2014.
Japanese Office Action for Application No. 2012031548 dated Sep. 1, 2014.
Japanese Office Action for Application No. 2012031549 dated Sep. 1, 2014.
Notice of Allowance for U.S. Appl. No. 29/425,831 dated Sep. 4, 2014.
European Patent Office Communication pursuant to Rule 114(2) EPC for Application No. 20110843026 dated Sep. 24, 2014.
Taiwanese Office Action for Application No. 100141887 dated Sep. 11, 2014.
Korean Decision of Rejection for Application No. 10-2013-7015669 dated Nov. 6, 2014.
Non-Final Office Action for U.S. Appl. No. 14/148,102 dated Dec. 5, 2014.
Taiwanese Notice of Allowance for Application No. 100141889 dated Dec. 8, 2014.
Notice of Allowance for U.S. Appl. No. 14/043,494 dated Dec. 10, 2014.
Non-Final Office Action for U.S. Appl. No. 13/224,850 dated Dec. 18, 2014.
Chinese Office Action for Application No. 201180065495.0 dated May 29, 2015.
Supplemental Notice of Allowance for U.S. Appl. No. 29/459,233 dated Aug. 13, 2015.
Notice of Allowance for U.S. Appl. No. 14/189,500 dated Jul. 17, 2015.
Final Office Action for U.S. Appl. No. 13/224,850 dated Jul. 22, 2015.
Chinese Office Action for Application No. 201180061776.9 dated Jun. 10, 2015.
Taiwanese Office Action for Application No. 101149281 dated Jun. 12, 2015.
Notice of Allowance for U.S. Appl. No. 14/043,494 dated Jul. 30, 2015.

(56) References Cited

OTHER PUBLICATIONS

Notice of Allowance for U.S. Appl. No. 14/148,102 dated Jul. 31, 2015.
Chinese Office Action for Application No. 201180065708.X dated Jun. 23, 2015.
European Search Report for Application No. 11 84 3026 dated Apr. 17, 2015.
Notice of Allowance for U.S. Appl. No. 14/148,102 dated Apr. 22, 2015.
Supplementary European Search Report for Application No. 11 84 3026 dated Apr. 28, 2015.
Notice of Allowance for U.S. Appl. No. 29/459,231 dated May 11, 2015.
Notice of Allowance for U.S. Appl. No. 14/189,500 dated May 14, 2015.
Notice of Allowance for U.S. Appl. No. 29/459,233 dated May 21, 2015.
Japanese Office Action for Application No. 2014-548830 dated May 19, 2015.
Supplemental Notice of Allowability for U.S. Appl. No. 14/043,494 dated May 28, 2015.
Japanese Office Action for Application No. 2012-031549 dated May 25, 2015.
Taiwanese Notice of Allowance for Application No. 100141887 dated May 28, 2015.
Non-Final Office Action for U.S. Appl. No. 13/800,284 dated Jun. 4, 2015.
Extended European Search Report for Application No. 12849022.4 dated Jun. 16, 2015.
Appeal Decision for Japanese Design Application No. 2012-031548 dated Jun. 17, 2015.
Non-Final Office Action for U.S. Appl. No. 14/673,263 dated Jun. 30, 2015.
Final Office Action for U.S. Appl. No. 13/296,812 dated Apr. 23, 2015.
Japanese Office Action for Application No. 2013/540955 dated Jul. 7, 2015.
Chinese Office Action for Application No. 201280066174.7 dated Jun. 3, 2015.
Final Office Action for U.S. Appl. No. 13/800,284 dated Oct. 22, 2015.
Korean Office Action for Application No. 10-2014-7014959 dated Nov. 9, 2015.
Japanese Office Action for Application No. dated Nov. 10, 2015.

* cited by examiner

ATTACHMENT DEVICES AND METHODS FOR LIGHT EMITTING DEVICES

CROSS REFERENCE TO RELATED APPLICATION

This application claims the benefit of and priority to U.S. Provisional Patent Application Ser. No. 61/416,184 filed Nov. 22, 2010, the disclosure of which is incorporated by reference herein in its entirety.

TECHNICAL FIELD

The subject matter disclosed herein relates generally to light emitting devices and methods. More particularly, the subject matter disclosed herein relates to attachment devices and methods for light emitting devices

BACKGROUND

Light emitting devices, such as light emitting diodes (LEDs), may be utilized in packages for providing white light (e.g., perceived as being white or near-white), and are developing as replacements for incandescent, fluorescent, and metal halide high-intensity discharge (HID) light products. A representative example of an LED device comprises a device having at least one LED chip, a portion of which can be coated with a phosphor such as, for example, yttrium aluminum garnet (YAG). The phosphor coating can convert light emitted from one or more LED chips into white light. For example, LED chips can emit light having desired wavelengths, and phosphor can in turn emit yellow fluorescence with a peak wavelength of about 550 nm. A viewer perceives the mixture of light emissions as white light. As an alternative to phosphor converted white light, light emitting devices of red, green, and blue (RGB) wavelengths can be combined in one device or package to produce light that is perceived as white.

FIGS. 1A and 1B illustrate a portion of a conventional, prior art light emitting device, generally designated 10. A portion of light emitting device 10 can comprise one or more attachment surfaces 14 disposed over a submount 12. Attachment surfaces 14 can provide an electrically conductive material for electrically connecting to external components, such as electrical components connected to a power source for supplying electrical current to the light emitting device 10. Submount 12 can comprise any suitable substrate or submount, for example a printed circuit board (PCB) or a metal core printed circuit board (MCPCB). At least a portion of submount 12 can comprise a heatsink, for example PCBs and MCPCBs can comprise thermally conductive layers including dielectric and/or metal core layers. Thus, heat generated from one or more LEDs (not shown) can dissipate quickly through submount 12. Joining components to attachment surfaces 14 using, for example, soldering techniques is inherently difficult. Typically, the entire submount 12 will need to be heated in order to get a good flow of solder to the solder contacts. If the LED component is already attached to a heatsink prior to wire-attach, the whole heatsink assembly needs to be heated. This can cause heating or over-heating of portions unsuited for such heat and can present time and energy constraints associated with installing and/or using light emitting devices in various applications.

FIG. 1B illustrates conventional, prior art attachment surface 14 for electrically connecting to an external electrical component. Electrical component can comprise an electrically conductive wire, generally designated 15. Wire 15 can comprise an electrically conductive connecting portion 16 and an insulated portion 18. Connecting portion 16 can comprise an exposed, or bare, wire portion typically constructed of an electrically conductive metal material. Conventional attachment surface 14 comprises a flat surface formed integral with submount 12 over which connecting portion 16 can be electrically connected. Such connection is typically performed by soldering connecting portion 16 to attachment surface 14 (solder not shown). In one aspect, submount 12 can be mounted to a heatsink prior to attaching wire 15 so that the wires can be short. As attachment surface 14 is flat and directly communicates with submount 12, heat can dissipate quickly from the area during soldering, thus making soldering connecting portion 16 to attachment surface 14 difficult, tedious, and time consuming.

Despite availability of various LED devices and methods in the marketplace, a need remains for improved attachment devices and methods suitable for industrial and commercial lighting products. LED devices and methods described herein can advantageously promote ease of manufacture by improving attachment members, such as solder contacts. Such attachment member can further advantageously include connectors that are solder free, gas-tight connections which eliminate the need to tediously solder components altogether.

SUMMARY

In accordance with this disclosure, novel attachment devices and methods for light emitting devices are provided that are well suited for a variety of applications, including industrial and commercial lighting products. It is, therefore, an object of the subject matter described herein to provide light emitting devices and methods comprising at least one raised attachment member, such as a solder contact. In other aspects, an object of the subject matter described herein is to provide light emitting devices and methods comprising at least one solder free, gas-tight electrical connector or attachment member.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
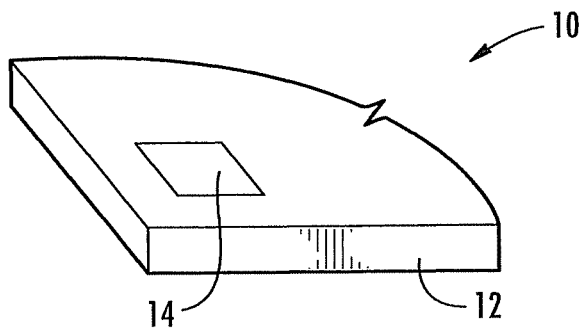
FIGS. 1A and 1B illustrate conventional attachment surfaces of light emitting devices.
Figure 1B:
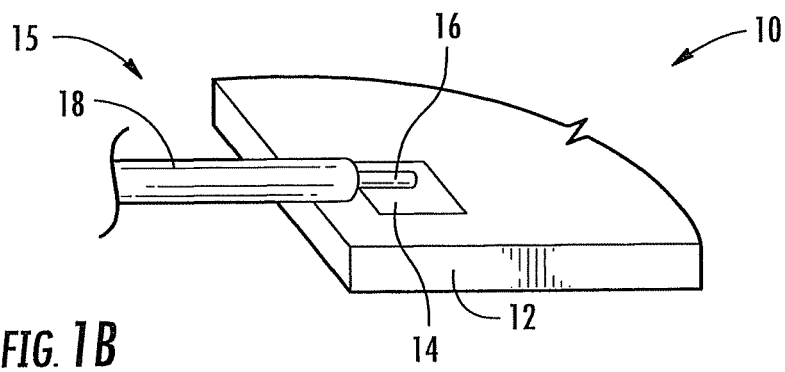

Reference will now be made in detail to possible aspects or embodiments of the subject matter herein, one or more examples of which are shown in the figures. Each example is provided to describe the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a growth substrate, for example, silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein. For example, sapphire and gallium arsenide can be utilized as growth substrates for fabricating LEDs or lasers as described herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. No. 5,210,051, U.S. Pat. No. 5,393,993, and U.S. Pat. No. 5,523,589, the disclosures of which are hereby incorporated by reference herein in their entireties.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have different thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (with or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

The LED can be coated, at least partially, with one or more phosphors with the phosphors absorbing at least a portion of the LED light and emitting a different wavelength of light such that the LED emits a combination of light from the LED and the phosphor. In one embodiment, the LED emits a white light which is a combination of light emission from the LED chip and phosphor. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Other suitable methods for coating one or more LEDs are described in U.S. patent application Ser. No. 12/014,404, entitled "Phosphor Coating Systems and Methods for Light Emitting Structures and Packaged Light Emitting Diodes Including Phosphor Coating" and the continuation-in-part application U.S. patent application Ser. No. 12/717,048, entitled "Systems and Methods for Application of Optical Materials to Optical Elements", the disclosures of which are hereby incorporated by reference herein in their entireties. LEDs can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED devices and methods according to the present subject matter can also have multiple LEDs of different colors, one or more of which may be white emitting. Although the focus of the discussion relates to white light, any other hue is contemplated herein.

Referring now to FIGS. 2 to 22, FIG. 2 illustrates a portion of a light emitting device, generally designated 20. Light emitting device 20 can comprise a submount 22 over which one or more LEDs (not shown) may be mounted. Submount 22 can comprise a PCB or metal core printed circuit board (MCPCB), each of which can comprise one or more thermally conductive layers or other laminate structure (FIG. 10). The thermally conductive layers may either be electrically insulating (e.g., dielectric) or conducting (e.g., metal). Light emitting device 20 can comprise a wire attachment surface on the surface of device 20 comprising an attachment member, generally designated 30. Wire attachment surface comprising attachment member 30 can be disposed on device 20 surface and can be adapted to receive a wire, generally designated 15, for bonding and can further comprise a pad or body portion 32 electrically coupled to device 20 typically via solder. The attachment member 30 can provide electrical connection between the wire and the device while reducing the thermal coupling between the wire 15 and pad portion relative to the pad portion and device 20 surface. Wire 15 can comprise any electrically and/or thermally conductive wire. In one aspect, attachment member 30 can be spaced apart from device 20 surface and can be configured to receive an external component, for example, a wire 15 for attachment to the wire attachment surface and for electrically coupling the wire 15 to device 20.

Attachment member 30 can be disposed over a portion of submount 22 during fabrication for electrically connecting to an external component. For example, attachment member 30 can be positioned over an attachment surface, similar to surface 14 (FIG. 1A) which electrically connects to and communicates with one or more LEDs of the device. (See also attachment surface 124, FIG. 13 and FIGS. 15A-E). Attachment member 30 can electrically connect and/or link external component with light emitting device 20. In one aspect, external component can comprise an electrically conductive component for supplying electrical signal, or current, to light emitting device 20. Attachment member 30 can comprise any suitable electrically conductive member and/or material for connecting to the external source. For example, attachment member 30 can comprise a solder contact for facilitating electrical connection with an external component capable of supplying electrical current to light emitting device 20. Attachment member 30 can be formed integral with submount 22 or as a separate portion attached to submount. Attachment member 30 can comprise any suitable electrically conductive material. In one aspect, attachment member 30 can comprise a metallic member including but not limited to copper, silver, stainless steel and/or other metals or alloys thereof. In other aspects as described further herein, attachment members can comprise a gas-tight (e.g., solder free) connector or separate PCB.

Figure 2:
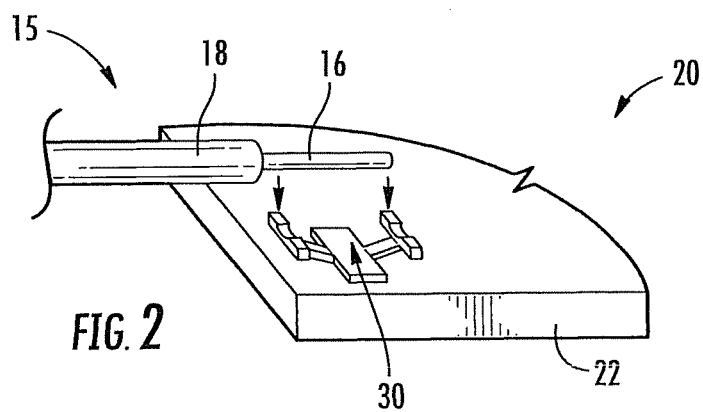
FIG. 2 is a top perspective view illustrating a portion of a light emitting device with attachment member according to the disclosure herein.

FIG. 2 illustrates an electrical component provided for electrically connecting to attachment member 30. Attachment member 30 can electrically communicate with submount 22 for supplying electrical current to one or more LEDs (not shown). Electrical component can comprise wire 15. Wire 15 can comprise a connecting portion 16 and an insulated portion 18. Connecting portion 16 can comprise an exposed, or bare, wire portion typically constructed of an electrically conductive material such as metal. Connecting portion 16 can be solid or stranded. As the arrows in FIG. 2 illustrate, connecting portion 16 of wire can be positioned over attachment member 30 and subsequently attached such as by soldering. Notably, connecting portion 16 will be positioned a distance away from submount 22. In one aspect, connecting portion 16 can be positioned at least over a portion of a raised portion of the attachment member utilized (See, for example, FIGS. 3A and 3B). In one aspect, connecting portion 16 can be placed at least partially within one or more grooves, or notches, of a raised portion of attachment member 30 (See, for example, FIG. 3A).

Figure 3A:
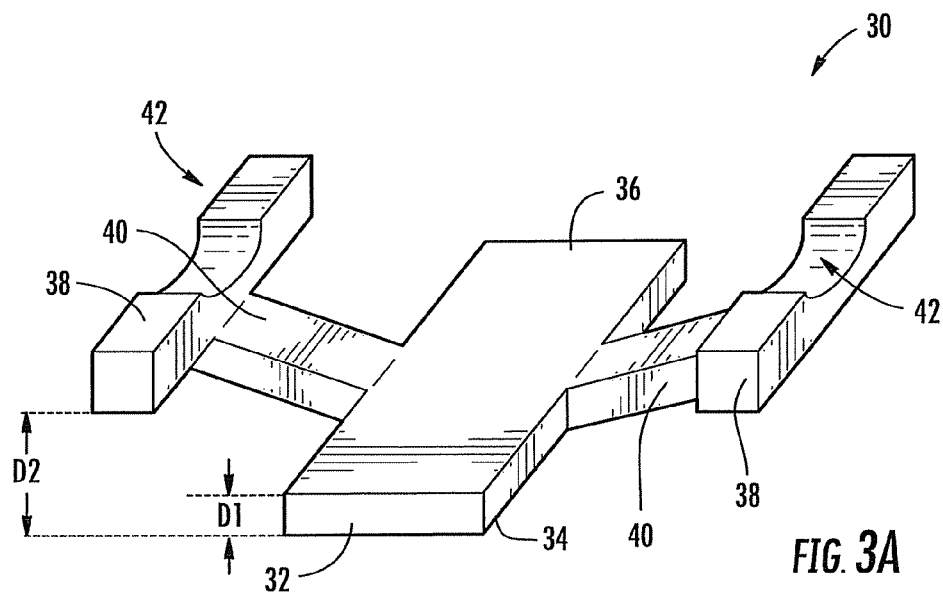
FIGS. 3A and 3B are perspective views illustrating different aspects of attachment members according to the disclosure herein.
Figure 3B:
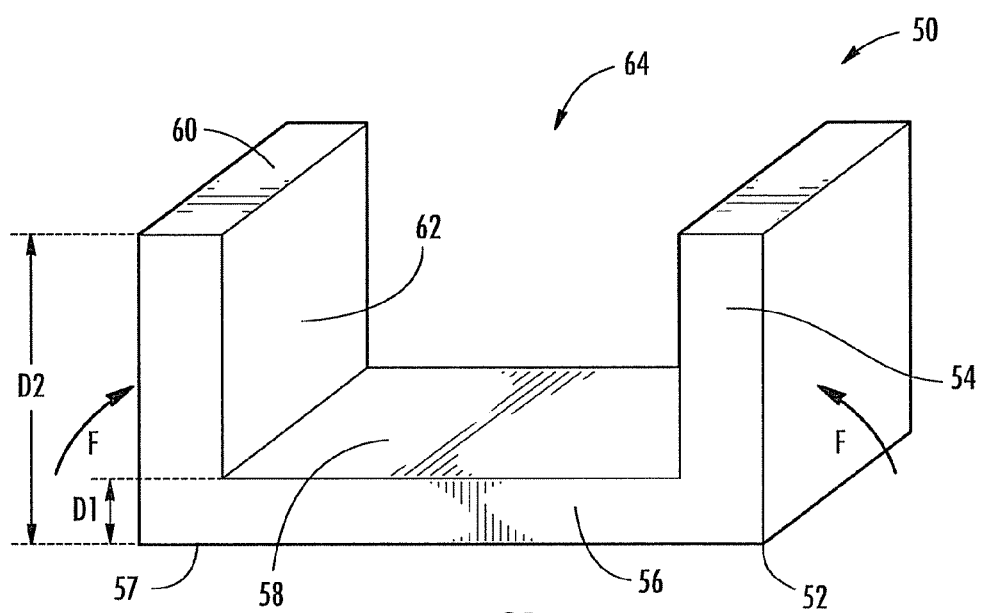

FIGS. 3A and 3B illustrate for example and without limitation aspects or embodiments of the attachment members possible. The attachment member can be disposed over and electrically communication with a submount of light emitting devices, (See, for example, FIGS. 7, 8A). For illustration purposes, two embodiments of an attachment member are illustrated, however, the attachment member can comprise any size, shape, and/or dimension other than those described herein. Attachment members can also comprise solder free connectors such as insulation displacement connectors (IDC), see FIGS. 17A and 17B and/or electrical connectors which receive and clamp the electrical wire component (e.g., see FIGS. 18-20). Suitable attachment members will position the connecting portion of a wire or other electrical component at least a distance greater than 0 millimeters (mm) away from a submount of a light emitting device. FIG. 3A illustrates attachment member 30 comprising a body portion 32 having an upper surface 36 and a lower surface 34. Although body portion 32 is illustrated as substantially rectangular, any suitable shape is contemplated herein not limited to a square, rectangle, circle, polygon and/or any other suitable size, shape and/or dimension. Body portion 32 can be disposed adjacent at least one raised portion 38. In one aspect, body portion 32 can be disposed adjacent and substantially central and between least two raised portions 38 as shown in FIG. 3A that be identical or different from one another in configuration. The two raised portions 38 can be disposed on and extend by connection of legs 40 from opposing sides of body portion 32. Each body portion 32 can comprise at least one leg 40 that can extend from body portion 32 and can link or interconnect body portion 32 with raised portion 38. Leg 40 can be formed integral with body portion 32, and integral or as a separate piece from raised portion 38. In one aspect, raised portion 38 can comprise an extension of leg 40. In one aspect, raised portion 38 can be disposed substantially parallel but on a different plane than body portion 32. Leg portion 40 can be disposed along at least a portion of the length of body portion 32 and can incline upwardly away from body portion 32. The width and/or shape of leg portion 40 can be any suitable width for effectively interconnecting body portion 32 and raised portion 38.

Attachment member 30 can be substantially rigid or can be bendable and/or adjustable for locating the wire 15 at any suitable distance from submount 72. For example, each raised portion 38 can be bendable about leg 40. Each raised portion 38 can also comprise at least one groove, or notch, generally designated 42. In some aspects, grooves or notches 42 are unnecessary (e.g., FIG. 14F, groove is in a phantom line). One or more notches 42 can comprise attachment portions adapted to receive and attach to electrical components, e.g., electrical wire 15. Notch 42 can be disposed along at least a portion of an edge of raised portion 38 and disposed at one end or central to raised portion 38. In one aspect, notch 42 can be disposed at least substantially centrally on raised portion 38 and can be rounded concave inwardly towards body portion 32 to substantially correspond to a portion of the circumference and/or radius of external component, for example, the connecting portion 16 of wire 15 (FIG. 2). In one aspect, at least a portion of notch 42 becomes physically and electrically attached and/or soldered to connecting portion 16.

Attachment member 30 can have at least a first distance D1 between upper and lower surfaces 36 and 34 of body portion 32. Attachment member 30 can also comprise a second distance D2 from a bottom surface of raised portion 38 to bottom surface 34 of body portion 32. At least a portion of connecting portion 16 of wire 15 can be positioned and subsequently soldered or otherwise attached at least first and/or second distances D1 or D2 away from submount, or at any distance between D1 and D2. Distance D1 can be any distance greater than 0 mm. Connecting portion 16 of wire can be positioned at least partially over upper surface 36 of body portion and at least partially disposed within at least one notch 42 of raised portion 38. Alternatively, connecting portion 16 of wire 15 can be disposed above body portion 32 suspended above body portion 32 within notches 42 of opposing raised portions 38. Soldering, or otherwise attaching wire 15 to attachment member 30 can electrically couple wire 15 to device, for example, LED device, such that one or more LEDs within the device can receive electrical signal and become illuminated.

FIG. 3B illustrates for example a second embodiment of an attachment member, generally designated 50. Attachment member 50 can comprise a body portion 52 comprising one or more upper body portions 54 and at least one lower body portion 56. Upper body portions 54 can each comprise a raised portion of attachment member 50 and lower body portion 56 can comprise a central body portion. Lower body portion 56 can comprise a lower surface 57 and an upper surface 58. Upper surface 58 can comprise an attachment portion over which the connecting portion of wire 15 (FIG. 8A) can be positioned and physically and electrically connected and/or attached using solder or any other attachment technique. The at least one upper body portion 54 can comprise at least one inner wall 62 disposed adjacent and at an angle to upper surface 58 of lower body portion 56. Inner wall 62 can be orthogonal or non-orthogonal to upper surface 58. In one aspect, attachment member 50 can comprise at least two upper body portions 54 opposing each other with at least a portion of lower body portion 56 disposed therebetween. A gap generally designated 64 can exist between the one or more upper body portions 54, and the upper body portions 54 can be parallel with each other. In one aspect, attachment member 50 can comprise a substantially U-shaped member.

Attachment member 50 can provide one or more attachment portion located at least a first distance D1 away from a submount. In one aspect, upper surface 58 of lower body portion 56 can serve as comprise a first attachment portion located a first distance D1 away from a submount. In another aspect a second upper surface 60 of raised, or upper body portion 54 can comprise a second attachment portion located a second distance D2 away from a submount. In one aspect, second upper surface 60 is parallel upper surface 58 and spaced a distance apart from upper surface 58. First and second distances D1 and D2 can comprise any suitable distance greater than 0 mm. Second distance D2 can be greater than first distance D1. In one aspect, connecting portion 16 of wire can be positioned at least partially over upper surface 58 and attached such that it is in electrical communication with attachment member 50. Alternatively, connecting portion 16 of wire 15 can be positioned at least partially over second upper surface 60 of at least one upper body portion 54. In one aspect, connecting portion 16 of wire 15 can be positioned at least partially over at least two upper surfaces 60 of two opposing upper body portions 54 and subsequently soldered, or otherwise electrically connected to attachment member 50. In one aspect, soldering is unnecessary for electrically connecting wire 15 to attachment member 50. For example, one or both upper body portions 54 can press inwardly via a force F indicated by the arrows. Force F can squeeze one or both upper body portions 54 against connecting portion 16 of wire 15 such that the wire becomes crimped between upper body portions 54. Thus, connecting portion 16 can be fixedly held between upper portions of attachment member 50 via a solder free connection, and attachment member 50 can electrically communicate with connecting portion 16.

While crimping is shown, any connection which fixedly holds and secures connecting portion 16 is envisioned in accordance with the subject matter herein. Also, an attachment member such as disclosed herein can be provided with or without a plastic housing, such as a plastic housing disposed about the area where the wire is crimped or otherwise held in place. As used herein, the term 'solder free' when describing a connector and/or connection refers to the connection between portions of wire 15 and attachment members described herein (e.g., 50, 140 (FIGS. 16A through C) 150 (FIG. 17A), 170 (FIG. 18)). Of note, attachment members may be soldered to an attachment surface (e.g., 124, FIG. 13 or FIGS. 15A-E) of submount 72 prior receiving wire 15. However, the physical, mechanical, and/or electrical connection between portions of wire 15 and attachment members can be described as solder free, as portions of wire 15 are not attached via soldering to attachment members or connectors described herein. Notably, such connections can advantageously reduce installation and manufacturing times as tedious soldering processes become obsolete, as well as reduce cost associated with installation of devices incorporating solder free connections or connectors.

Figure 17A:
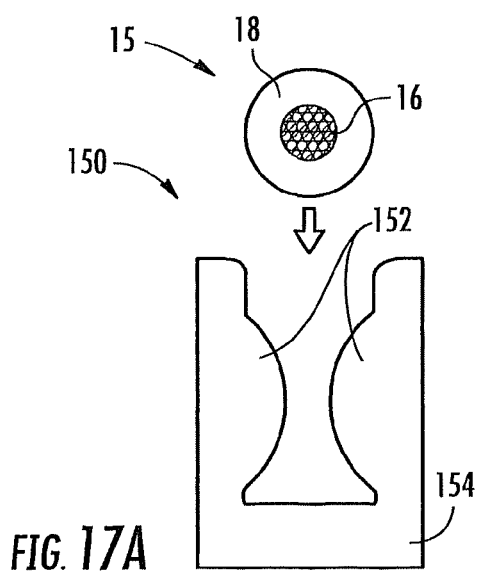
FIGS. 17A to 17C are cross-sectional views of different embodiments of attachment members according to the disclosure herein.
Figure 17B:
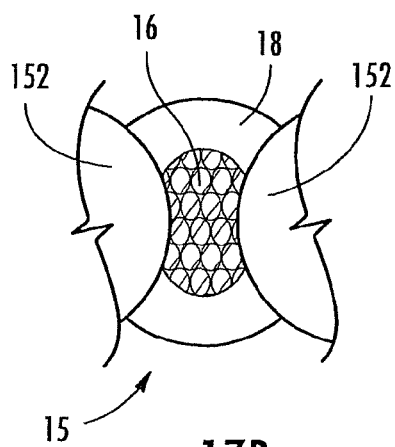

Each of the attachment members illustrated by FIGS. 3A and 3B can be attached and in electrical communication with light emitting devices 70 and/or 90 as illustrated for example in FIGS. 4 through 12. Thus, when external electrical components, such as one or more wires 15 are connected and/or attached to the attachment member, an electrical signal or current can flow into the attachment member and light emitting device 70 and/or 90 and into one or more LEDs 86 (FIGS. 6,7) thereby illuminating the device. In one aspect, attachment members disclosed herein can comprise solder free connectors, as solder may not be necessary for the connection of wire 15 to attachment member 50. For example and without limitation, attachment member 50 can comprise a non-solder, gas-tight connector. In one aspect, attachment member 50 can comprise an insulation displacement connector (IDC) type of attachment member. IDCs can contain a contact member for piercing or otherwise displacing the insulated covering 18 of wire 15 and allowing current to flow from the connecting portion 16, into the light emitting device 70 and/or 90 (FIGS. 17A and 17B). In other aspects, attachment member 50 an comprise a solder free connector which clamps, crimps, or otherwise receives and holds connecting portion 16 of wire 18 (e.g., see FIGS. 18-20). IDCs can be advantageous in one aspect, as they eliminate the need for manufacturing components with tedious soldered electrical connections which can sometimes fail if inadequately soldered or if heat from the soldering process damages other areas or components. Notably, IDCs are solder free components which improve handling and ease of use and manufacturing of devices and/or components as described herein. In addition, no manual stripping of wires prior to soldering is necessary, as the IDC contact member displaces the wire upon insertion.

Each of the attachment members described herein, including 30 and 50 can further comprise insulated wire guides (not shown). Insulated wire guides can comprise a piece of electrically insulating material (e.g., plastic) positioned on attachment member and/or submount to prevent the wire 15 from shorting or electrically arcing to the edge of the MCPCB submount 72.

Figure 4:
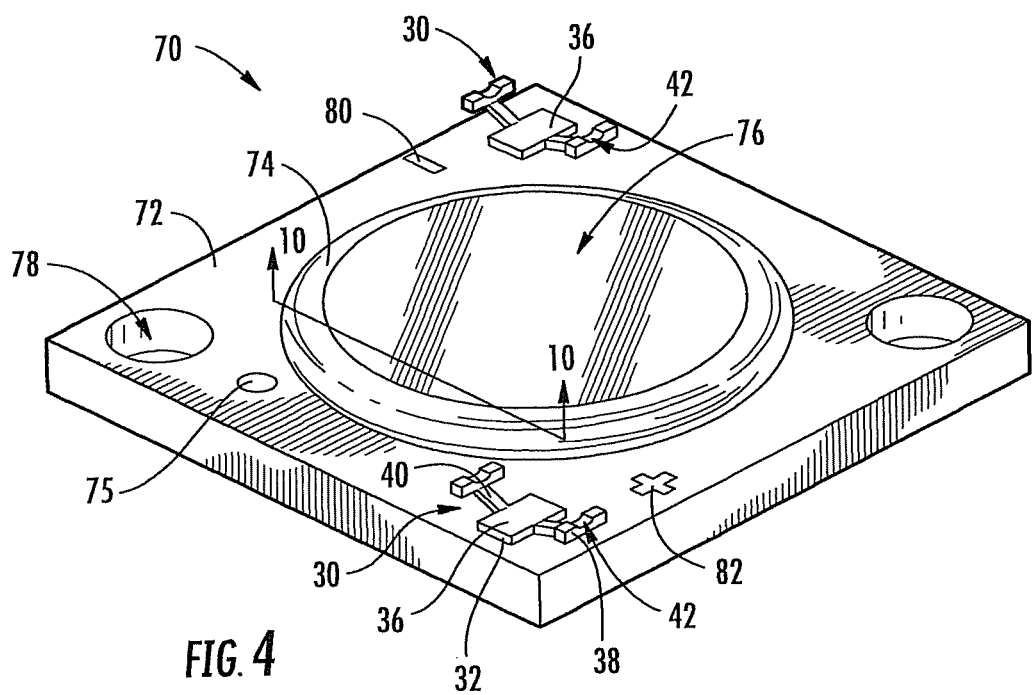
FIG. 4 is a top perspective view illustrating an embodiment of a light emitting device and attachment member according to the disclosure herein.
Figure 11:
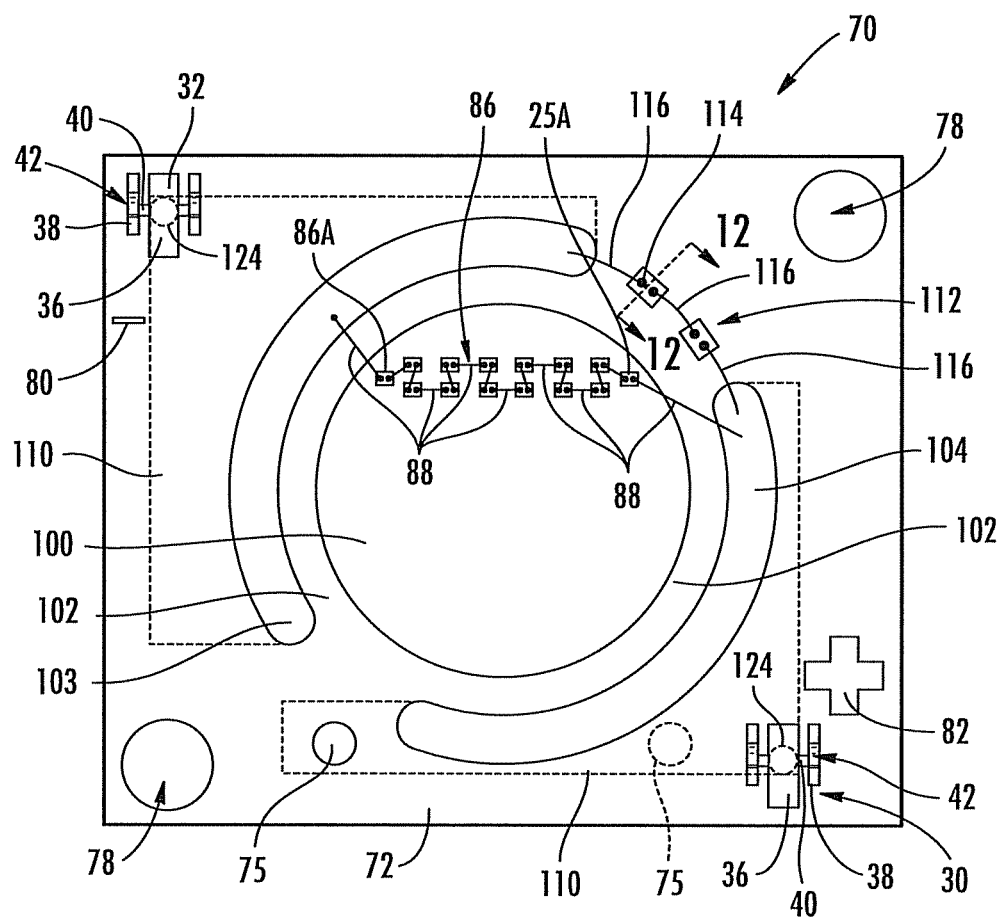
FIG. 11 is a top view illustrating a light emitting device according to the disclosure herein.
Figure 12:
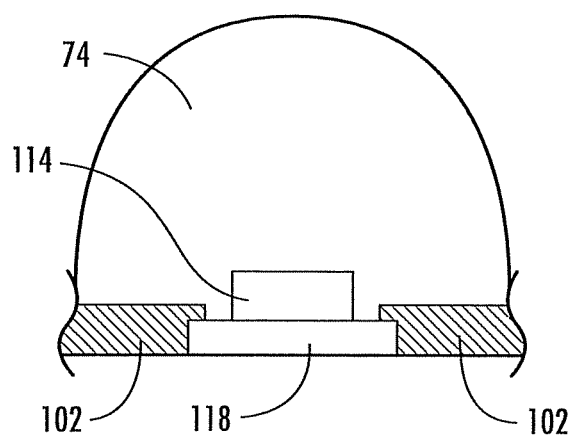
FIG. 12 is a cross-sectional view illustrating a gap area of a light emitting device according to the disclosure herein.

FIG. 4 illustrates a top view of a light emitting or LED device, generally designated 70. LED device 70 can comprise a substrate or submount 72 over which an emission area, generally designated 76, can be disposed. In one aspect, emission area 76 can be disposed substantially centrally on LED device 70. In an alternative, emission area 76 can be disposed in any other suitable location on LED device 70. Notably, LED device 70 can comprise a uniform optical source in the form of emission area which can simplify the manufacturing process for manufacturers of light products requiring a single component. LED device 70 can further comprise a retention material 74 disposed at least partially about emission area 76 where retention material 74 can be referred to as a dam. Retention material 74 can also be disposed over at least one electrostatic discharge (ESD) protection device, such as a Zener diode 114 (FIG. 12). In some aspects, retention material can be disposed over more than one, such as two, Zener diodes 114 that can be connected in series between two electrical elements (FIG. 11).

Submount 72 can comprise any suitable mounting substrate or submount, for example, a PCB, a MCPCB, an external circuit, or any other suitable submount over which lighting devices such as LEDs may mount and/or attach. In one aspect, submount 72 can have a compact dimension of, for example, 22 millimeter (mm)×22-mm square footprint. In other aspects, submount 72 can be any suitable dimension and/or shape, for example, a circular or rectangular shape.

Figure 6:
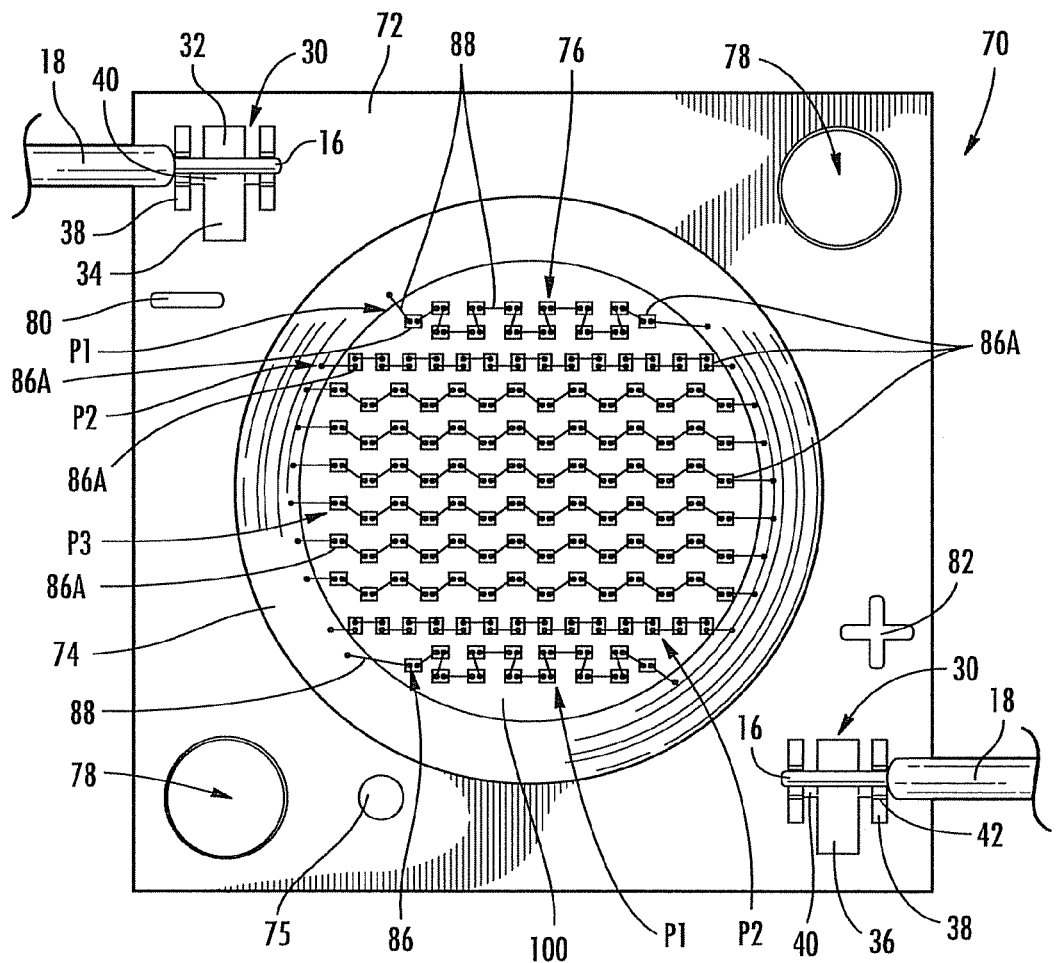
FIG. 6 is a top plan view illustrating an embodiment of a light emitting device having one or more patterns of light emitting diodes (LEDs) according to the disclosure herein.

Emission area 76 can comprise a plurality of LED chips, or LEDs 86 disposed within and/or below a filling material 87 such as illustrated in FIG. 10. Retention material 74 can be adapted for dispensing, or placing, about at least a portion of emission area 76. As illustrated in FIG. 6, retention material 74 can be dispensed after wirebonding of the one or more LEDs 86 such that retention material 74 is disposed over and at least partially covers wirebonds 88 to contain at least a portion, such as one end of each of wirebonds 88 within retention material 74. In FIG. 6, wirebonds 88 for the first and last, or outermost edge LEDs 86A for a given string, or series of LEDs 86 are disposed within retention material. In one aspect, retention material 74 can be "planed" during dispersion at room temperature for accurate volume and/or height control. After placement of retention material 74, filling material 87 (FIG. 10) can be filled to any suitable level within the space disposed between one or more inner walls of retention material 74. For example, filling material 87 (FIG. 10) can be filled to a level equal to the height of retention material 74 or to any level above or below retention material. The level of filling material 87 (FIG. 10) can be planar or curved in any suitable manner, such as concave or convex. Emission are 76 can be substantially opaque (as illustrated in FIG. 4), transparent, or semi-transparent depending upon, for example, the amount and type of phosphor or other fillers that are used in filling material 87 (FIG. 10).

Figure 7:
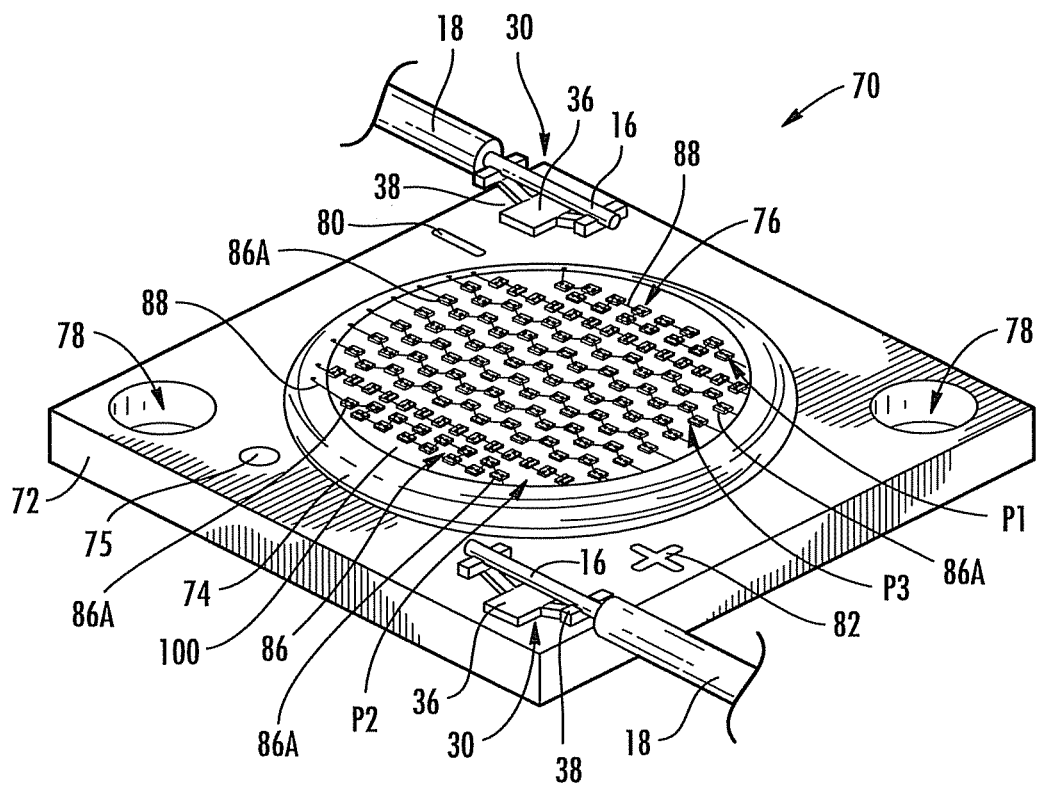
FIG. 7 is a top perspective view illustrating an embodiment of a light emitting device having one or more patterns of LEDs according to the disclosure herein.

Still referring to FIG. 4, LED device 70 can also comprise at least one opening or hole, generally designated 78, disposed through submount 72 for facilitating attachment of LED device 70 to an external substrate or surface. For example, one or more screws can be inserted through the at least one hole 78 for securing device 70 to another member, structure, or substrate. LED device 70 can also comprise one or more electrical attachment members 30 and/or 50 as described in FIGS. 3A and 3B. FIG. 4 illustrates at least one attachment member 30 which can comprise at least one electrical contact such as solder contacts disposed at the corner of light emitting device 70 for connecting to external components. Attachment member 30 can comprise any suitable configuration, size, shape and/or location and can comprise positive and/or negative electrode terminals through which an electrical current or signal can pass when connected to an external power source. For example, one or more electrically conductive wires (FIGS. 2, 8) can be attached and electrically connected to attachment members 30 and/or 50 when welded, soldered, or any otherwise suitably attached. Electrical current or signal can pass into LED device 70 from the external wires electrically connected to the attachment members 30 and into emission area 76 comprised of LEDs 86 (FIGS. 6, 7, 10) to facilitate light output. Attachment members 30 can electrically communicate with emission area 76 comprised of LEDs 86 (FIGS. 6, 7, and 10). Attachment members 30 can electrically communicate with first and second conductive traces 103 and 104 (see FIG. 11) and therefore LEDs 86 which may be wirebonded or otherwise electrically connected to first and second conductive traces 104 and 103.

LED device 70 can further comprise an indicator sign or symbol for denoting the electrical polarity for a given a side of LED device 70. For example, a first symbol 80 can comprise a "−" sign denoting the side of LED device 70 comprising the negative electrode terminal. A second symbol 82 can comprise a "+" sign denoting the side of LED device 70 comprising the positive electrode terminal. One or more test points 75 can be located adjacent either a positive or negative side of the device for testing the electrical and/or thermal properties of the LED device 70. In one aspect, test point 75 can be disposed adjacent the negative side, or terminal of LED device 70. In an alternative embodiment, test point 75 can be disposed adjacent the positive side of LED device 70.

Figure 5:
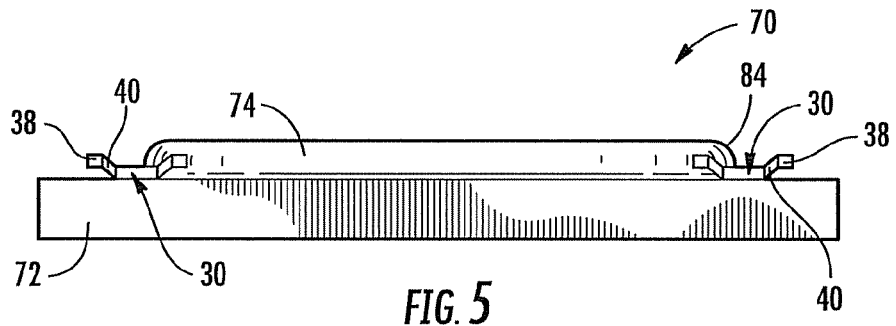
FIG. 5 is a side view illustrating an embodiment of a light emitting device and attachment member according to the disclosure herein.

FIG. 5 illustrates a side view of LED device 70. As illustrated by FIGS. 4 and 5, retention material 74 can comprise a substantially circular dam disposed about at least a portion of emission area 76 and disposed over submount 72. Retention material 74 can be dispensed, positioned or otherwise placed over submount 72 and can comprise any suitable size and/or shape. Retention material 74 can comprise any suitable reflective material and can comprise a clear or opaque white material such as, for example, a silicone or epoxy material. Filler particles such as titanium dioxide ($TiO_2$), for example, can be used and added to retention material 74 for providing an opaque material. The addition of $TiO_2$ can increase reflection about the emission area 76 to further to optimize light output of LED device 70. Fumed silica can be added as a thixotropic agent. Dispersing retention material 74 can allow increased board space and the ability to withstand higher voltages. In some aspects, LED device 70 can be operable at 42 volts (V) or higher.

Retention material 74 can be dispensed or deposited in place using an automated dispensing machine where any suitable size and/or shape of dam can be formed. As FIG. 5 illustrates in a side view of LED device 70, retention material 74 can comprise a rounded outer wall 84 such that the upper surface of retention material 74 opposite submount 72 is rounded. Rounding or curving outer wall 84 of retention material 74 may further improve the amount of light reflected by LED device 70. FIG. 5 also illustrates placement of one or more attachment members 30 disposed in corners outside of retention material 74. As the side view illustrates, attachment member 30 can comprise at least one leg 40 extending at an incline to a raised portion 38 of the attachment member 30 for providing an attachment area spaced a distance from submount 72. While the height of attachment member 30 can be any suitable extent form the surface of the submount 72, in one aspect attachment member 30 can extend to a height or distance D2 such that raised portion 38 is still not as high as the height of retention material 74 as shown for example in FIG. 5.

FIGS. 6 and 7 illustrate emission area 76 without a layer of filling material 87. FIG. 6 illustrates LED device 70 and emission area 76 comprising at least one pattern, or arrangement, of LEDs. LEDs 86 can be arranged, disposed, or mounted over a conductive pad 100. Conductive pad 100 can be electrically and/or thermally conductive and can comprise any suitable electrically and/or thermally conductive material. In one aspect, conductive pad 100 can comprise a conductive metal. In one aspect, emission area 76 can comprise one or more LEDs 86 arranged in a single pattern over conductive surface, or pad 100. In the alternative, emission area 76 can comprise a combination of more than one pattern of LEDs 86 arranged over conductive pad 100. In one aspect, emission area 76 can comprise a combination of different arrangements or patterns, for example, a combination of a first pattern P1, a second pattern P2 and/or a third pattern P3 for optimizing light emission and device brightness. Each string of LEDs 86 disposed over conductive pad 100 can comprise outermost LEDs 86A with one or more LEDs 86 disposed therebetween. Each string of LEDs 86 can comprise the same or a different pattern, for example, patterns P1, P2, and/or P3. Strings of LEDs 86 can comprise diodes of the same and/or different colors, or wavelength bins, and different colors of phosphors can be used in the filling material 87 (FIG. 10) disposed over LEDS 86 that are the same or different colors in order to achieve emitted light of a desired wavelength. The one or more patterns of LEDs 86 can comprise an array of LEDs within emission area 76.

Still referring to FIGS. 6 and 7, attachment member 30 can provide electrical connection between the electrical wire 15 and device 70 while reducing the thermal coupling between the wire 15 and the body portion 32 of attachment member 30 relative to thermal coupling between body portion 32 and a surface of device 70. Raised portions 38 can be spaced apart from device 70, and adapted to maintain the wire 15 spaced apart from a surface of device 70. Attachment member 30 can be adapted to retain wire 15 prior to bonding. Wire attachment surface or attachment member 30 can comprise a reduced area portion relative to a pad or body portion of the wire attachment surface directly on surface of device or submount 72. As illustrated, attachment portion, e.g., notch 42 of raised portion 38 can comprise a reduced surface area relative to an area of body portion 32 of attachment member 30. The reduced area portion can be adapted to reduce the thermal conductivity of attachment portion notch 42 relative to the pad or body portion 32. That is, attachment portion of attachment member 30 can comprise a reduced thermal conductivity relative to the body portion 32 of attachment member 30. Therefore, it can be easier to attach or solder wire 15 to notch 42 than to attach wire 15 to the body 32 which is directly disposed over submount 72, as submount 72 can quickly draw heat away from thermally conductive body 32.

Figure 8A:
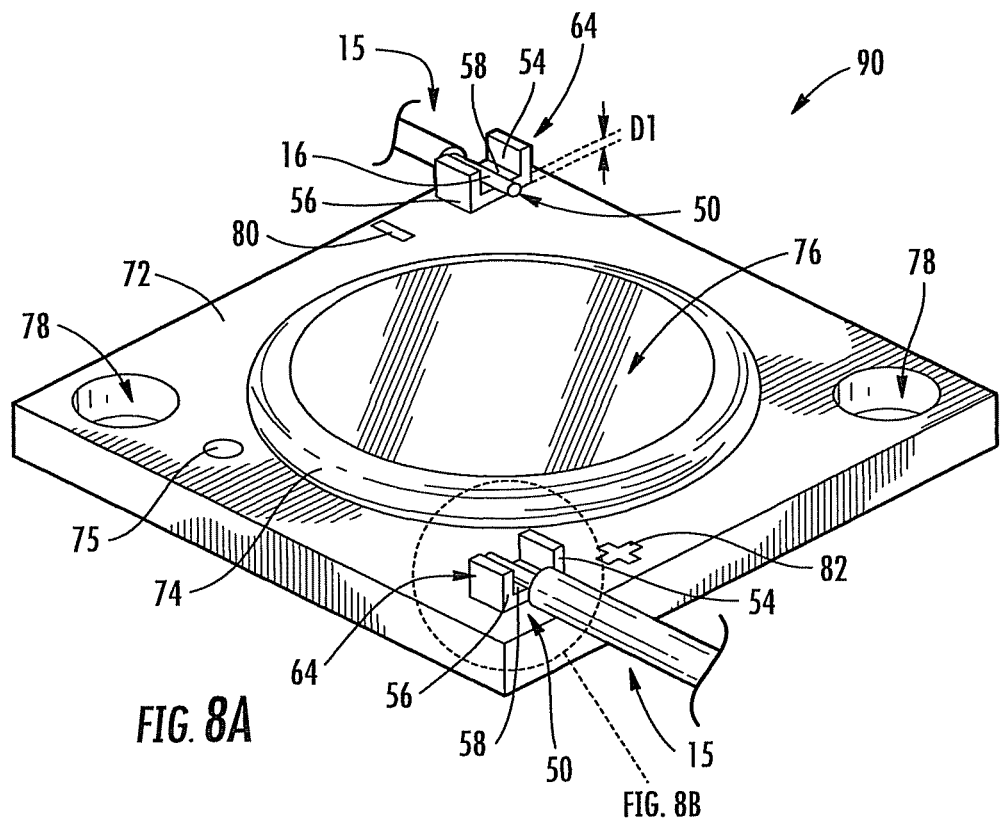
FIG. 8A is a top perspective view illustrating an embodiment of a light emitting device and attachment member according to the disclosure herein.

FIG. 8A illustrates a second embodiment of a LED device, generally designated 90. LED device 90 is similar in form and function to LED device 70 but having attachment member 50 as shown and described in FIG. 3B. FIG. 8A illustrates at least one attachment member 50 disposed in a first corner of LED device 90 and a second attachment member 50 disposed at an opposite end and along an opposite edge of LED device 90. Each attachment member 50 can correspond to a positive and negative terminal of LED device 90 for passing current through the device. FIG. 8A illustrates connecting portion 16 of wire being positioned down and over attachment member 50 such that it is disposed over upper surface 58. Once connecting portion 16 is positioned, it can be subsequently welded, soldered, crimped, or otherwise attached to attachment member 50 at a distance D1 away from submount 72.

Figure 8B:
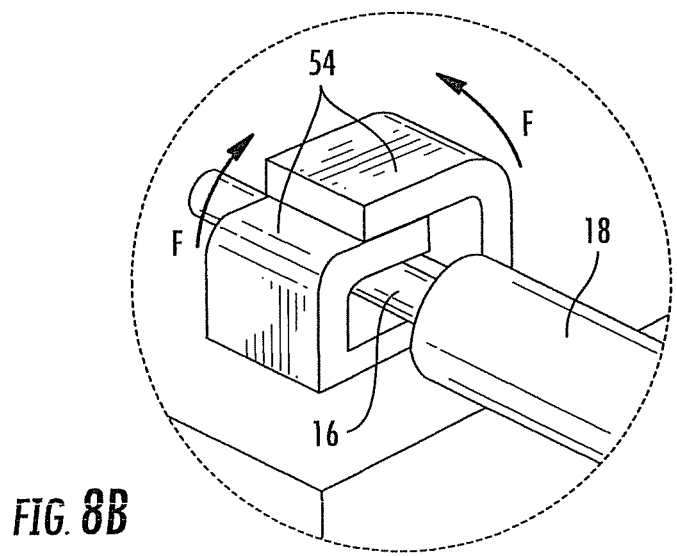
FIG. 8B is a top perspective view of a portion of the light emitting device and attachment member of FIG. 8A.

FIG. 8B illustrates a portion of LED device 90 in FIG. 8A. FIG. 8B illustrates attachment member 50 attached and held in electrical communication with wire 15 for passing current through device 90. Upper body portions 54 of attachment member 50 can be pressed via force F (FIG. 3B) such that connecting portion 16 of wire 15 can be crimped and fixedly attached to device 90 by attachment member 50. Electrically conductive wire 15 can electrically communicate with electrically conductive attachment member 50 when held in contact with each other. As illustrated by FIG. 8B, at least a portion of conductive wire 15 can be attached via a solder free connection with attachment member 50.

Figure 9:
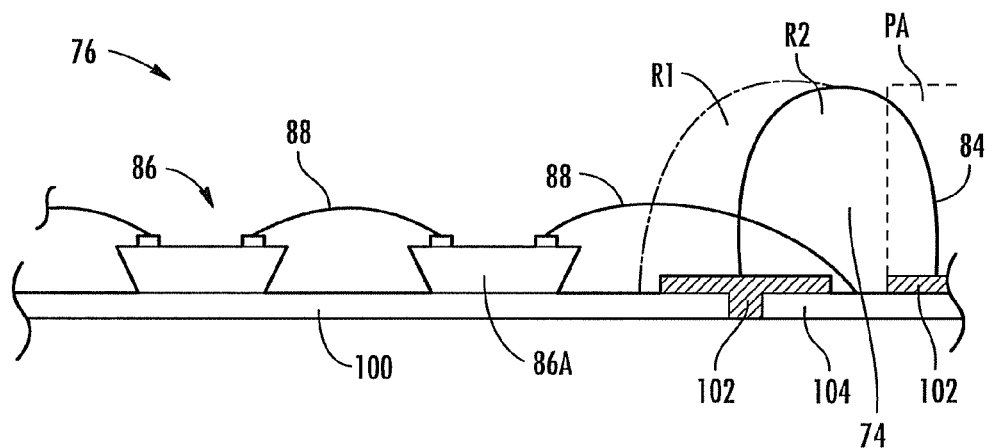
FIG. 9 is a first cross-sectional view illustrating a light emission area of a light emitting device according to the disclosure herein.
Figure 10:
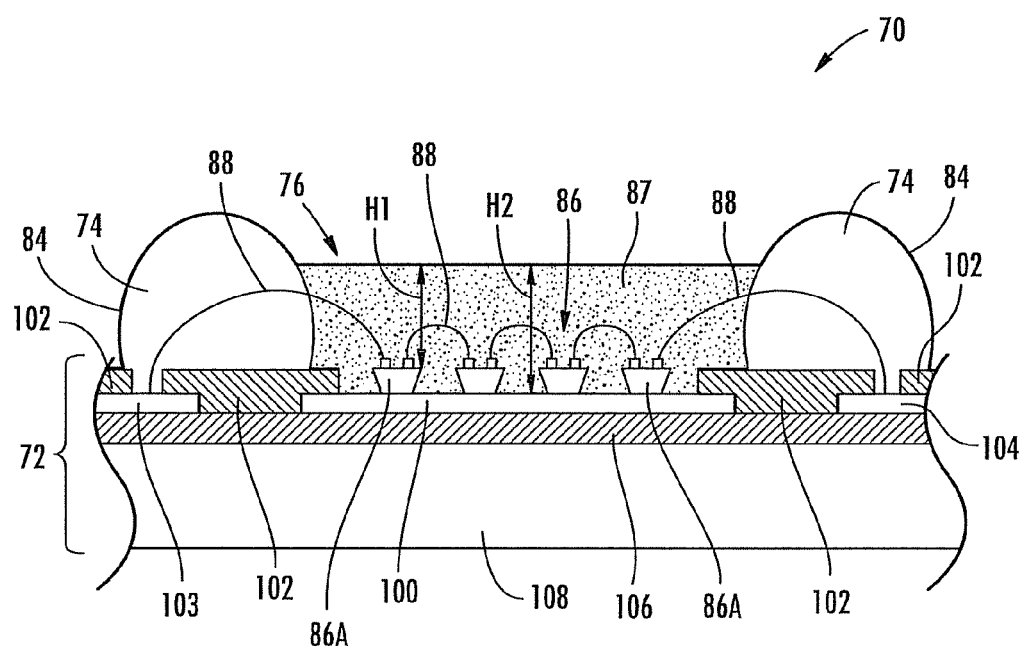
FIG. 10 is a second cross-sectional view illustrating a light emission area of a light emitting device according to the disclosure herein.

As FIGS. 9 and 10 further illustrate, the outermost LEDs 86A for a series, string, or pattern of LEDs 86 can electrically communicate or connect to one or more electrical elements. Electrical elements can comprise first and second conductive traces 103 and 104 configured to flow, or supply electrical signal or current to the respective strings of LEDs 86. One of first and second conductive traces 103 and 104 can comprise an anode and the other a cathode. The electrical polarity can be denoted by first and second symbols 80 and 82 as discussed earlier. Conductive pad 100 and conductive traces 103 and 104 can comprise any suitable electrical and thermally conductive materials and can comprise either the same or different materials. In one aspect, conductive pad 100 and conductive traces can comprise a layer of copper (Cu) deposited over submount using any suitable technique. An electrically insulating solder mask 102 can be disposed at least partially between conductive pad 100 and respective conductive traces 103 and 104. Solder mask 102 can provide an electrical barrier between conductive traces and can comprise a white reflective surface.

FIG. 9 illustrates various placement areas, positions, or locations of retention material 74 about emission area 76. In one aspect, retention material 74 can be disposed in areas, positions, or locations R1, R2, and/or any location therebetween. When retention material 74 is disposed in locations R1 or R2, it can be disposed over and cover at least a portion of one or more wirebonds 88 connecting outermost LEDs 86A to electrical elements, such as conductive trace 104. When in location R1, retention material 74 can be disposed at least partially over each of solder mask 102 and wirebond 88 connected to outermost LED 86A for a respective string of LEDs 86. In one aspect, retention material 74 can be disposed entirely over the portion of solder mask 102 disposed between conductive pad 100 and conductive trace 104 and/or entirely over wirebond 88 when in location R1. In another aspect, retention material 74 can be disposed over and at least partially or entirely cover each of the wirebonds 88 of each of the outermost LEDs 86A for each string of LEDs 86 disposed in emission area 76. As illustrated, retention material 74 according to the subject matter herein comprises a substantially rounded or hemispheric shaped cross-section. Rounding retention material 74 can increase the surface area from which light may be emitted and/or reflected.

FIG. 10 illustrates emission area 76 comprising a string of one or more LEDs 86 disposed within a filling material 87. For illustration purposes four LEDs 86 are shown but strings of LEDs 86 can comprise any suitable number of LEDs, for example, 14 LEDs 86 arranged in series. In one aspect, filling material 87 can comprise an encapsulant having a predetermined, or selective, amount of phosphors, fillers, and/or lumiphors in an amount suitable for any desired light emission, for example, suitable for white light conversion. Filling material 87 can interact with light emitted from the plurality of LEDs 86 such that a perceived white light, or any suitable and/or desirable wavelength of light, can be observed. Any suitable combination of encapsulant and/or phosphors can be used, and combinations of different phosphors for resulting in desired light emission can be used. In other aspects, filling material 87 can comprise a molded lens material. In further aspects, filling material 87 can comprise a lens that floats over LEDs 86. Filling material 87 can be substantially opaque such that emission area 76 can be substantially opaque (as illustrated in FIG. 4), transparent, or semi-transparent depending upon, for example, the amount and type of phosphor or other fillers that are used.

FIG. 10 illustrates a cross-section of submount 72 over which LEDs 86 can be mounted or otherwise arranged. Submount 72 can comprise, for example, conductive pad 100, first and second conductive traces 103 and 104, and solder mask 102 at least partially disposed between conductive pad 100 and each of conductive traces 103 and/or 104. If retention material is positioned adjacent outermost LEDs 86A, for example in location R1, solder mask 102 between conductive pad 100 and first and second conductive traces 103 and 104 could be eliminated as it would may no longer be necessary. Solder mask 102 can be disposed between conductive traces 103 and 104 and attachment members 30 (FIG. 11), the proximal edges of which can be seen in FIG. 10 adjacent retention material 74, adjacent the outer wall 84 of retention material 74. Submount 72 can further comprise a dielectric layer 106, and a core layer 108. For illustration purposes, submount 72 can comprise a MCPCB, for example, those available and manufactured by The Bergquist Company of Chanhassan, Minn. Any suitable submount 72 can be used, however, including those that use metal, ceramic or polymer base materials and hybrid structures.

FIG. 10 further illustrates examples of first and second heights H1 and H2 of filling material 87 within LED device 70. First height H1 can comprise a height at which filling material 87 is disposed over the LEDs 86. The height may vary due to process variability, so an average height above the string of LEDs 86 can be used and controlled for optimal brightness and other characteristics (e.g., color point, uniformity, etc.). Second height H2 can comprise a height at which filling material 87 is disposed over a top surface of conductive pad 100. Second height H2 can be controlled, for example, by controlling the location of retention material 74 and whether it assumes location R1, R2 or any position therebetween. Second height H2 can also be controlled by controlling the amount of filling material 87 dispensed into the cavity defined by retention material 74. Raised portion 38 of attachment member 30 and/or upper surface 60 of attachment member 50 can comprises distances D2 which can extend to a height less than the height of the retention material 74 and/or first and second heights H1 and H2.

FIG. 11 illustrates LED device 70 comprising submount 72 prior to arranging, dispensing, or otherwise placing retention material 74 about at least a portion of emission area 76. For illustration purposes, only a first string of LEDs 86 is illustrated, however, as noted earlier, emission area can comprise more than one string of LEDs 86 electrically connected in series. As illustrated, prior to placing retention material 74, submount 72 comprises first and second conductive traces 103 and 104 arranged in a substantially circular arrangement about conductive pad 100 such that LEDs arranged over conductive pad 100 can electrically communicate to each trace by wirebonding and wirebonds 88 or by any other suitable attachment method. For illustration purposes, traces 103 and 104 are illustrated as substantially circular, however, any orientation is contemplated. As illustrated, outermost LEDs 86A for a respective string of LEDs 86 can electrically connect to conductive traces. Dotted lines 110 illustrate the size and/or shape of electrically conductive material of which the conductive traces 103 and 104 are comprised. The lines are dotted to illustrate how the material can be disposed under solder mask 102. Thus, conductive pad 100 and traces 103 and 104 are exposed portions or layers of conductive material such as Cu (i.e., exposed on a surface of submount 72) whereas dotted lines 110 illustrate portions of conductive material below solder mask 102. Test point 75 can also be exposed on a surface of submount 72, and can also be comprised of the electrically conductive material illustrated by dotted line 110. Test point 75 can be disposed to the left of trace 104 as shown, or between trace 104 and attachment member 30 as indicated by test point 75 in broken lines.

Attachment members 30 electrically and/or thermally communicate with respective conductive traces via the layer of conductive material defined by dotted lines 110, and can comprise the same layer of material. In one aspect, the material formed within the bounds of dotted lines 110 comprises Cu, and can be plated or otherwise layered with one or more reflection enhancement layers, for example, Ag, Ni, Ti, or dielectric materials. External, conductive wires (not shown) can electrically connect to attachment members 30, and electrical current or signal can flow from the attachment members 30 to the respective conductive traces. Attachment member can physically and electrically couple to submount 72 via attachment surfaces 124 (see FIG. 13 or FIGS. 15A-E) by soldering to attachment surfaces 124 (see FIG. 21) as further described herein. As attachment surfaces 124 are exposed portions of submount 72 comprised of conductive material (i.e., material indicated by dotted lines 110) and are disposed below attachment members 30, surfaces 124 are also illustrated in broken lines, and can include any size and/or shape (e.g., see FIGS. 11 and 15A-15E), for illustration purposes only a circle attachment surface 124 is shown. The electrical current can flow from attachment members 30 into attachment surfaces 124 of submount 72 and along the conductive material designated by dotted lines 110 disposed below the layer of solder mask 102. The electrical current can flow into and/or out of the conductive traces and therefore into and out of respective strings of LEDs 86 mounted over conductive pad 100.

As noted earlier, Zener diodes 114 and, other electronic components are typically black and absorb light. FIG. 12 illustrates Zener diode 114 upon placement of the retention material. In one aspect, retention material 74 can be disposed at least partially over the at least one Zener diode 114. In another aspect, retention material 74 can be disposed entirely over the at least one Zener diode 114 such that the diode is completely covered for further improving light output intensity. Zener diode 114 can be disposed over an electrically and/or thermally conductive surface or area 118 such that current can flow through the diode 114, into the wirebonds 116, and to respective conductive traces 103 and 104. In one aspect, Zener diode 114 comprises a vertically structured device having one bond pad (not shown) on an upper surface that is wirebonded in reverse bias with respect to LEDs 86 for providing ESD protection.

Figure 13:
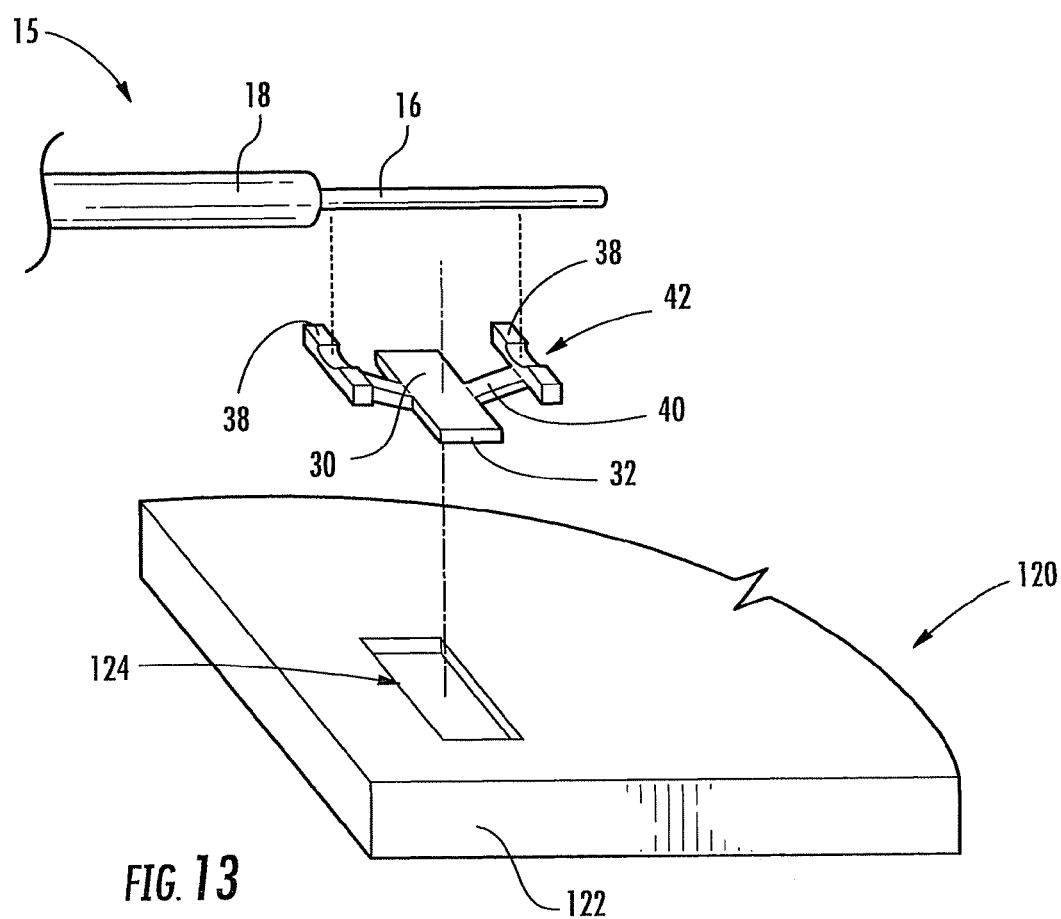
FIG. 13 is a top perspective view illustrating a portion of a light emitting device with attachment member according to the disclosure herein.

FIG. 13 illustrates a portion of LED device, generally designated 120. LED device 120 can comprise a device submount 122. In one aspect, LED device 120 can comprise a portion of previously described LED device 70. An attachment surface, generally designated 124, can comprise an exposed portion of submount 122. Attachment surface 124 can comprise a depth (as illustrated) with respect to an upper surface of submount 122, or it may comprise a surface that is a substantially flat portion of submount 122. Attachment surface 124 can comprise an electrically conductive material that can electrically couple attachment member 30 to device 70. In one aspect, attachment surface 124 can be integrally formed with device submount 122, for example, not limited to being formed as a layer of submount 122 (e.g., having as size and shape of area 110 in FIG. 11). That is, attachment surface 124 can extend below a portion of solder mask 102 (FIG. 10) and electrically connect with exposed trace 104, as attachment member 124 and trace 104 can comprise the same layer of material. In another aspect, attachment surface 124 is a separate surface which can be deposited or otherwise adapted to electrically communicate with submount 122.

Attachment member 30, previously described with respect to FIG. 3A, can physically and electrically connect to attachment surface 124 such at least a portion of attachment member 30 electrically couples to each of attachment surface 124 and device 120. Attachment member 30 can attach to attachment surface 124 using any suitable method such that attachment member is suitably disposed over submount 122. In one aspect, attachment member 30 can be soldered to attachment surface 124. As previously described, attachment member 30 can comprise a body portion 32 and one or more raised portions 38 with one or more notches 42 disposed therein. Notches 42 can comprise attachment portions for receiving and bonding to connecting portion 16 of an electrical wire 15 such that wire 15 and the device 120 are electrically coupled upon bonding the wire to the attachment member 30. Electrical signal can pass from the wire 15 into attachment member 30 and device 120 for illuminating one or more LEDs attached to and/or electrically connected to device 120.

Attachment member 30 can comprise an attachment portion, e.g., notches 42 of raised portion 38 adapted to receive connecting portion 16 of electrical wire 15 for electrically bonding to wire 15. Attachment member 30 can also comprise a body portion 32 electrically coupled to device 120 via attachment surface 124. Attachment member 30 can provide electrical connection between the electrical wire 15 and device 120 while reducing the thermal coupling between the wire 15 and the body portion 32 relative to the body portion 32 and the device surface. Raised portions 38 can be spaced apart from device 120, and adapted to maintain the wire spaced apart from a surface of device 120. Attachment member 30 can be adapted to retain wire 15 prior to bonding. Wire attachment surface or attachment member 30 can comprise a reduced area portion relative to a pad or body portion of the wire attachment surface directly on surface of device or submount 72. As illustrated, attachment portion, e.g., notch 42 of raised portion 38 can comprise a reduced surface area relative to an area of body portion 32 of attachment member 30. The reduced area portion can be adapted to reduce the thermal conductivity of attachment portion notch 42 relative to the pad or body portion 32. That is, attachment portion of attachment member 30 can comprise a reduced thermal conductivity relative to the body portion 32 of attachment member 30. Therefore, it can be easier to attach or bond wire 15 to notch 42 of attachment member 30 than to the body 32 which is directly disposed over submount 122 which can quickly draw heat away from thermally conductive body 32.

Figures 14A, 14B, 14C:
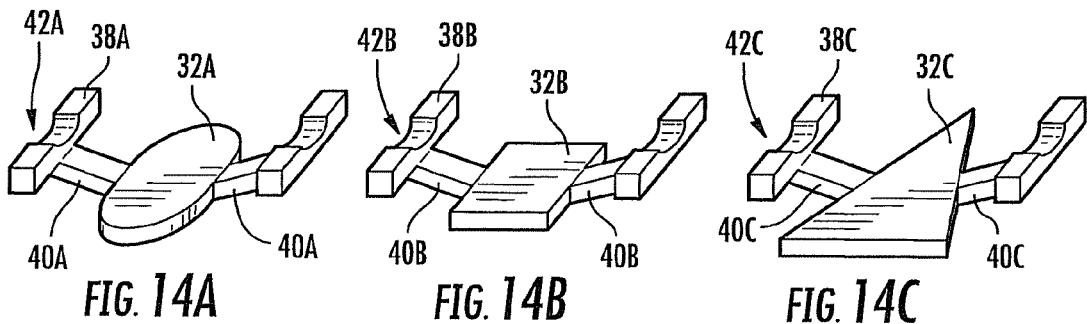
FIGS. 14A to 14H are top perspective views illustrating different embodiments of attachment members according to the disclosure herein.

FIGS. 14A to 14H illustrate different embodiments of attachment members. FIGS. 14A to 14F can comprise different embodiments of attachment member 30. FIG. 14A illustrates an attachment member having a substantially circular and/or rounded body portion 32A. Raised portion 38A can be spaced apart from body portion 32A. Similarly, FIG. 14B illustrates attachment member having a substantially square shaped body portion 32B with raised portion 38B spaced a distance away from body portion 32B. FIG. 14C illustrates a substantially triangular shaped body portion 32C and raised portion 38C spaced a distance therefrom. As illustrated, areas of raised portion adapted to receive wire 15 can comprise a reduced surface area relative to body portions 32A, 32B, and 32C. This can improve the ease of bonding a wire to attachment portion, e.g., via notches 42A, 42B, and 42C of attachment members in 14A to 14C. Each of the attachment members illustrated in FIGS. 14A to 14C can comprise legs 40A, 40B, and 40C respectively which elevate raised portions 38A, 38B, and 38C with respect to corresponding body portions. Legs 40A, 40B, and 40C can comprise a smaller width than that of corresponding body portions.

Figures 14D, 14E, 14F:
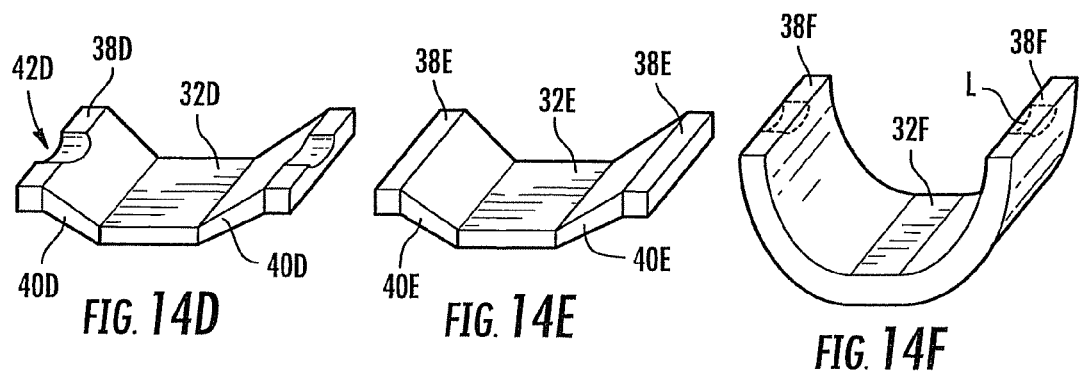

FIGS. 14D to 14F illustrate further embodiments of attachment member 30. In FIGS. 14D and 14E, legs 40D and 40E elevate raised portions 38D and 38E with respect to corresponding body portions 32D and 32E. Legs 40D and 40E can comprise approximately the same width as a width of corresponding body portions 32D and 32E. FIG. 14D illustrates an attachment member having a notch 42D for receiving and holding an external component such as a wire. FIG. 14E illustrates a design without a notch, and any of the embodiments of attachment members described herein can optionally comprise a notch or have no notch. Wire could simply become soldered or otherwise attached to raised portions 38E. FIG. 14F illustrates an embodiment of an attachment member comprising substantially curved surfaces. The attachment member comprises a body portion 32F which extends into more than one raised portion 38F. As illustrated by phantom lines L, raised portions can optionally comprise a notch or area for receiving an external electrical component. The attachment member illustrated by FIG. 14F comprises a substantially U-shaped attachment member. Any shape is contemplated. For illustration purposes, six different embodiments of attachment member 30 are illustrated by FIGS. 14A to 14F. However, attachment member 30 is not limited to the shapes and sizes shown. Attachment member 30 can comprise any suitable size, shape, and/or dimension of body portion and/or raised attachment portion.

Figures 14G, 14H:
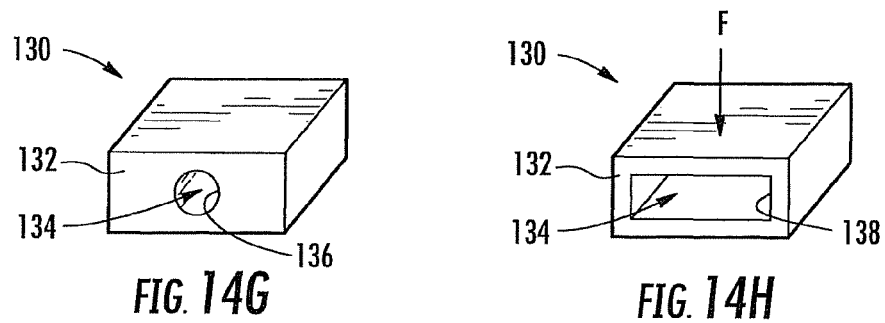

FIGS. 14G and 14H illustrate different embodiments of attachment members, generally designated 130. Attachment members 130 can comprise a body 132 having one or more openings 134 disposed therein. In one aspect, attachment member 130 comprises a circular opening 134 comprising a circular wall 136. Circular wall 136 of opening 134 can be substantially sized and/or shaped to fittingly receive the external element, component, or wire to be positioned therein. An electrical component, such connection portion 16 of wire 15 (FIG. 2) could be positioned within opening 134. Wire could be soldered within opening 134 or areas adjacent and outside of wall 136 thereby securing wire within opening. FIG. 14H illustrates attachment member 130 comprising an opening 134 having more than one inner wall 138. Here, opening 134 can comprise four inner walls 138 forming a substantially rectangular opening 134. Opening 134 can receive an electrical component, for example, connecting portion 16 of wire 15 (FIG. 2) and wire can become secured within attachment member 130 by applying a force F to essentially crimp or compress the wire between one or more walls 138 of attachment member 130. While crimping is shown or other structure is utilized to hold and secure the attachment member in place, positioning attachment member 130 within any suitable housing, such as a plastic housing, is contemplated and envisioned in accordance with the subject matter disclosed herein.

Figures 15A, 15B, 15C, 15D, 15E:
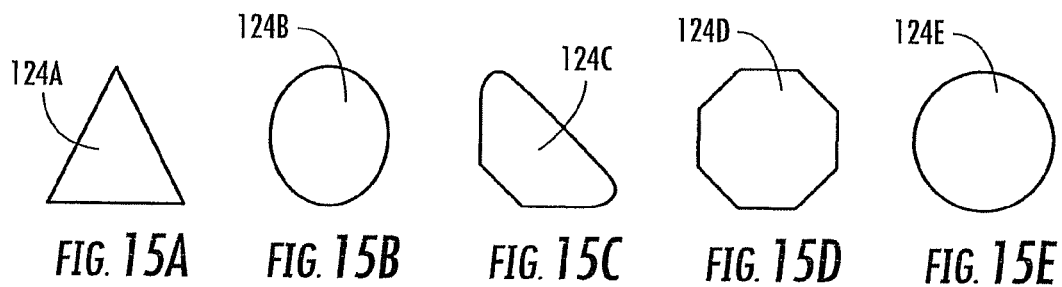
FIGS. 15A to 15E illustrate different embodiments of attachment surfaces according to the disclosure herein.

FIGS. 15A to 15E illustrate different shapes of attachment surface 124 illustrated by FIG. 13. Attachment surface 124A comprises a substantially triangular shape and attachment surface 124B comprises a substantially oval shape. FIG. 15C illustrates attachment surface 124C as having an irregular shape having curved and straight sides. FIG. 15D illustrates attachment surface 124D having a substantially octagonal shape, and FIG. 15E illustrates attachment surface 124E having a substantially circular shape. Generally, the shape of attachment surfaces can be selected to contemplate the shape of the body (e.g., 32) of attachment members provided herein. Any suitable shape and/or dimension of attachment surface 124 are contemplated herein, for example, a square, regular or irregular polygon, or even asymmetrical shapes. Attachment surface 124 can be configured to electrically and physically connect to attachment members described herein via any suitable attachment process. In one aspect, attachment members described herein can be soldered to attachment surfaces 124. As noted earlier, solder free connectors refer to the connection between attachment members and electrical components such as wire 15, and does not refer to the connection between attachment members and attachment surface. Notably, solder free connectors can advantageously improve ease of manufacture and ease of use during operation as soldering processes of connecting wire 15 to attachment members can be avoided. Solder free connectors simplify electrical connections between wire 15 and attachment members described herein and allow devices to be quickly and easily installed and/or changed out during operation.

Figure 16A:
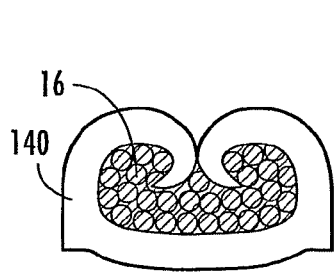
FIGS. 16A to 16C are cross-sectional views of different embodiments of attachment members according to the disclosure herein.
Figure 16B:
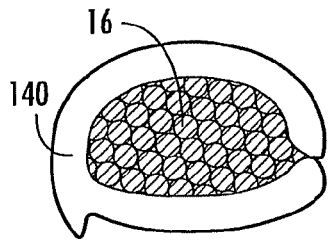
Figure 16C:
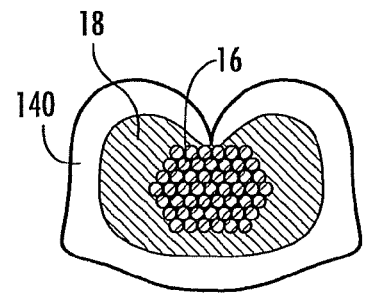
Figure 16D:
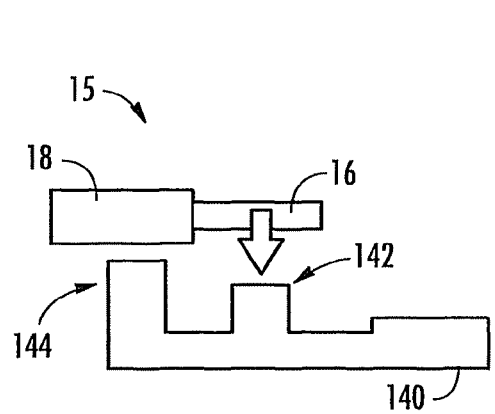
FIG. 16D is a side view of an attachment member according to the disclosure herein.

FIGS. 16A through 16D illustrate different embodiments of gas-tight, solder free connections between portions of wire 15 and attachment member 140. That is, solder may not be necessary to connect wire 15 to attachment member 140. FIGS. 16A to 16C illustrate an attachment member 140 disposed about a connecting portion 16 of wire 15 (FIG. 2). FIG. 16D is a side view of attachment member 140 disposed about insulated portion 18 and connecting portion 16 of wire 15. Attachment member 140 can be similar in form and/or function to previously described attachment member 50 which can be disposed over a portion of light emitting devices 70, 90, and/or 120. In one aspect, as illustrated in FIGS. 16A and 16B, attachment members 140 can essentially crimp and/or forcibly enclose connecting portion 16 of wire such that attachment member 140 is in electrical communication with connecting portion 16. FIG. 16C illustrates an insulation crimp whereby attachment member 140 can crimp and/or forcibly enclose about insulated portion 18 of wire 15. In this embodiment, attachment member 140 can penetrate or "bite through" through insulated portion to electrically communicate with connecting portion 16. Notably, attachment members 140 form gas-tight solder free connections with insulated portion 18 and/or connecting portion 16 of wire 15, such that electrical current or signal may be communicated from wire into the underlying light emitting devices. As used herein, the term 'solder free' when describing a connector or connection refers to the connection between portions of wire 15 and attachment members described herein. Of note, attachment members may be soldered to an attachment surface (e.g., 124, FIG. 13) of submount 72 prior receiving wire 15. However, the physical, mechanical, and/or electrical connection between portions of wire 15 and attachment members can be described as solder free, as portions of wire 15 are not attached via soldering.

The connection disclosed for example by FIG. 16C could be used in conjunction with connections disclosed in 16A and/or 16B to provide mechanical stability (hold) to the insulation so that it can be pulled back. For example and in one aspect as illustrated by FIG. 16D, attachment member 140 can comprise a connector that employs a combination of the cross-sectional embodiments disclosed by FIGS. 16A to 16C. That is, in one aspect attachment member 140 can comprise a double contact housing, where a first portion or channel 142 of member 140 can receive and crimp about a stripped or bare connecting portion 16 of wire (e.g., where the cross-sectional view would be similar to FIG. 16A) thereby forming a first electrical contact, and a second portion or channel 144 of member 140 can electrically connect with insulated portion 18 while electrically connecting with connection portion 16 (e.g., cross-sectional view of FIG. 16C) thereby forming a second electrical contact. In other aspects, attachment member 140 can comprise a single contact housing, where only first portion 142 electrically connects with connecting portion 16 of wire 15 and where second portion 144 physically and securely holds insulated portion 18 of wire. That is, second portion 144 can, but does not have to, bite into insulated portion 18 without making electrical contact with connecting portion 16 and can serve to mechanically hold wire 15 in place via securely gripping, biting, or otherwise holding insulated portion 18. Attachment member 140 can comprise one or more portions for electrically connecting with wire 15 in any of the combinations illustrated by FIGS. 16A to 16C. A crimp tool (not shown) can be used to crimp or clamp connecting portion 16 into first channel 142 and insulated portion 18 into second channel 144 thereby forming a gas-tight, solder free connection. Attachment member 140 can comprise a connector formed from a phosphor bronze alloy that has been coated with nickel (Ni), gold (Au), and/or tin (Sn).

Figure 17C:
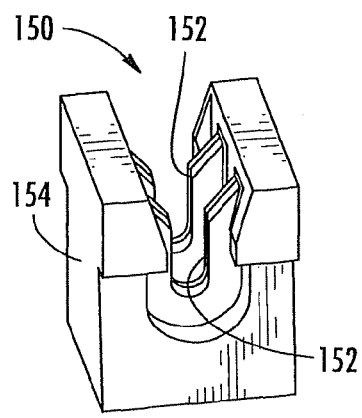
Figure 18:
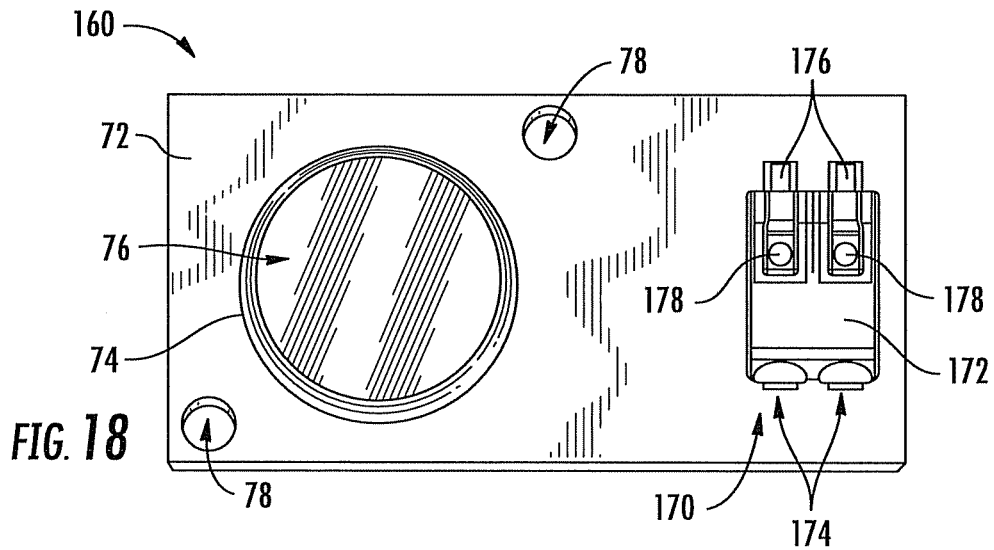
FIG. 18 is a top view illustrating a light emitting device and attachment member according to the disclosure here.

FIGS. 17A to 17C illustrate further embodiments of an attachment member 150. Attachment member 150 can be similar in form and/or function as previously described attachment member 50 and can be disposed over a portion of light emitting devices 70, 90, and/or 120. In one aspect, attachment member 150 can comprise a non-solder or solder free gas-tight connector. In one aspect, attachment member 150 can comprise an insulation displacement type connector or IDC type of attachment member. Referring to FIGS. 17A and 17B, attachment member 150 can comprise one or more blade portions 152 configured for contacting, biting, piercing, or otherwise displacing insulated portion 18 of wire 15 such that connecting portion 16 is contacted upon positioning or insertion of wire 15 between blade portions 152. Blade portions 152 can physically and electrically communicate with wire 15. Blade portions 152 can be disposed within a housing 154. Electrical current can be communicated from wire 15 and into the underlying light emitting device via connection with attachment member 150. FIG. 17B illustrates blade portions 152 mechanically and electrically contacting connecting portion 16 of wire. Blade portions 152 can be integrally formed with housing 154 of attachment member 150 or it may comprise a separate portion or attachment and/or material. In one aspect, housing 154 of attachment member 150 can comprise a plastic housing and blade portions 152 can comprise an electrically conductive material such as a metal. In one aspect, blade portions 152 can comprise metallic blades for piercing insulated covering 18 of wire 15. IDCs can be advantageous as they eliminate the need for manufacturing components with tedious soldered electrical connections which can sometimes fail if inadequately soldered or if heat from the soldering process damages other areas or components. Notably, IDCs are solder free components which improve handling and ease of use and manufacturing of devices and/or components as described herein. In addition, no manual stripping of wires prior to soldering is necessary, as blade portions 152 of IDC attachment member 150 can strip the wire upon insertion, such as insertion in the direction indicated by the arrow in FIG. 17A.

FIG. 17C illustrates a second embodiment of attachment member 150, where attachment member has multiple sets of blades portions 152. That is, a first set of blade portions 152 can comprise an integral U-shaped blade portion having two sharp edges facing inwardly towards each other and configured to displace insulation of wire 15 to electrically connect with connecting portion 16 of wire. A second set of blade portions 152 can be disposed parallel to the first set, and can allow for a more robust electrical connection by piercing wire 15 in a second location to electrically connect to connecting portion 16. Thus, attachment member 150 can comprise a double contact connector within housing 154. In one aspect, housing 154 comprises a white plastic or insulating material.

FIGS. 18 to 21 illustrate another embodiment of a light emitting or LED device, generally designated 160, which can be similar in form and function to any of the previously described devices (e.g., any of devices 70, 90, or 120). In one aspect, an attachment member 170 can provide external electrical current to device 160 and can comprise a solder free connector for releasably engaging and disengaging an electrical component, such as an electrical wire 15. Attachment member 170 can comprise a solder free connector. As used herein, the term 'solder free' when describing a connector or connection refers to the connection between portions of wire 15 and attachment members described herein. Of note, attachment member 170 may be soldered to an attachment surface 124 (FIG. 13) of submount 72 prior receiving wire 15. However, the physical, mechanical, and/or electrical connection between portions of wire 15 and attachment member 170 can be described as solder free, as portions of wire 15 are not attached to member 170 via soldering.

LED device 160 can comprise submount 72 over which emission area 76 can be disposed. In one aspect, emission area 76 can be adapted to emit light upon exposure to electrical current, power, or signal. In one aspect, emission area 76 can be disposed substantially to one side or in one corner of LED device 160 and mounted over submount 72. In an alternative, emission area 76 can be substantially centrally disposed over submount 72 and/or in any other suitable location on LED device 160. Emission area 76 can comprise any suitable size and/or shape, for example, any substantially circular, square, rectangle, oval, regular polygon, irregular polygon, or asymmetric shaped area. In addition, more than one emission area 76 can be provided over submount 72. Notably, LED device 160 can comprise at least one uniform optical source in the form of emission area 76 which can simplify the manufacturing process for manufacturers of light products requiring a single component. LED device 160 can further comprise retention material 74 disposed at least partially about emission area 76 where retention material 74 can be referred to as a dam. Retention material 74 can also be disposed over at least one electrostatic discharge (ESD) protection device, such as a Zener diode 114 (FIG. 12). In some aspects, retention material can be disposed over more than one, such as two, Zener diodes 114 that can be connected in series between two electrical elements (FIG. 11).

As previously described, submount 72 can comprise any suitable mounting substrate or submount, for example, a PCB, a MCPCB, an external circuit, or any other suitable submount over which lighting devices such as LEDs 86 (FIG. 10) may mount and/or attach. Emission area 76 can be in electrical and/or thermal communication with submount 72. Emission area 76 can comprise a plurality of LED chips or LEDs 86 disposed within and/or below a filling material 87 as previously illustrated and described with respect to FIG. 10. In addition, LEDs 86 can be electrically connected to one or more electrical traces 103, 104 of submount 72 as previously illustrated and described with respect to FIG. 10. In one aspect, filling material 87 can comprise an encapsulant having a predetermined, or selective, amount of phosphors and/or lumiphors in an amount suitable for any desired color point or light emission, for example, suitable for white light conversion. Retention material 74 can be dispensed, placed, or otherwise positioned at least partially about emission area 76. After positioning retention material 74, filling material 87 can then be filled to any suitable level within the space disposed between one or more inner walls of retention material 74. For example, filling material 87 can be filled to a level equal to the height of retention material 74 or to any level above or below retention material. After placement of filling material 87, it may be cured or otherwise hardened prior to insertion of LED device 160 into an external lighting component or fixture (e.g., downlights, bay lights, etc.).

Still referring to FIGS. 18 to 21, LED device 160 can also comprise at least one opening or hole, generally designated 78, disposed through submount 72 for facilitating attachment of LED device 70 to an external substrate or surface. For example, one or more screws can be inserted through the at least one hole 78 for securing device 160 to another member, structure, or substrate.

Figure 20:
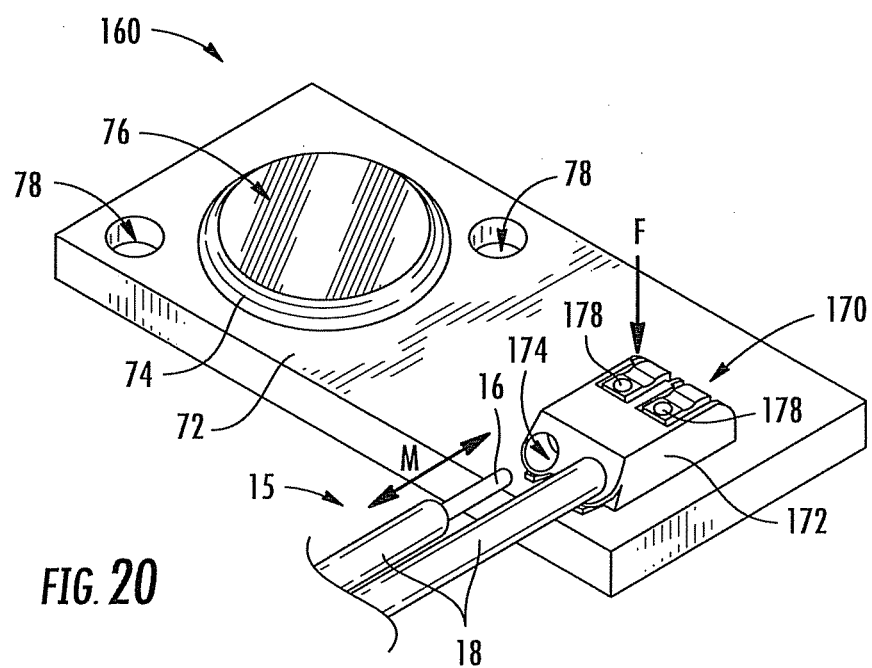
FIG. 20 is a top perspective view of the device in FIGS. 18 and 19 and illustrates electrical connection of an electrical component to attachment member.

LED device 160 can further comprise at least one electrical attachment member 170. Attachment member 170 can facilitate physical and electrical attachment of electrical components (e.g., electrical wire 15) to device 160 such that device 160 can receive electrical current, thereby illuminating one or more LEDs disposed within emission area 76. Attachment member 170 can be positioned or disposed at any location over submount 72 in any suitable manner, such as for example via an adhesive, electrically conductive tape, solder, or any other suitable connection method. Such adhesive, tape, and solder connection methods can physically and electrically connect attachment member 170 to submount 72. Attachment member 170 can comprise a housing 172 having one or more openings 174 for receiving a portion of one or more electrical components, for example, electrically conductive wires 15 (FIG. 20). Each opening 174 can comprise a positive, negative, or a combination of positive and negative electrode terminals through which corresponding electrical current or signal can pass from the electrically conductive connecting portion 16 one or more electrically conductive wires 15.

Electrical current can pass into and out of device 160 via wires 15 electrically communicating with one or more electrically conductive contacts 176 of housing 172, which in turn electrically communicate with submount 72 via one or more attachment surfaces (e.g., FIGS. 13 and 15A to 15E). In one aspect, conductive contacts 176 (e.g., corresponding to an anode and a cathode) electrically communicate to more than one attachment surface (e.g., two attachment surfaces also corresponding to a cathode and anode) which electrically communicate with electrical traces 103, 104 (FIG. 10, also corresponding to an anode and a cathode) thereby illuminating LEDS 86 within emission area 76. For example, a bottom surface of housing (not shown) can comprise one more electrically conductive bottom contacts 176 that upon connection to submount 72, can electrically communicate with one or more attachment surfaces (e.g., similar to those illustrated in FIGS. 13 and 15A-15E) of LED device 160. Thus, electrical current can flow along a path beginning and ending at connecting portions 16 of one or more wires 15. In one aspect, electrical current can flow from a first wire 15 into contacts 176 and into submount 72 via an attachment surface. Current can continue to flow into LEDs 86 of emission area 76 and then back out of device 160 via electrical traces 103, 104 (e.g., FIGS. 10 and 11). Current can then pass back into housing 172 and out of a second wire 15. Bottom contacts 176 may be fully disposed over bottom surface of housing 172 such that no portion of the contacts are visible from the outside, or the contacts 176 may extend beyond the external walls of housing 172 as shown. Contacts 176 can comprise any suitable electrically and/or thermally conductive metal or material such as Sn, Cu, or a phosphor bronze alloy that can be Sn coated.

Figure 19:
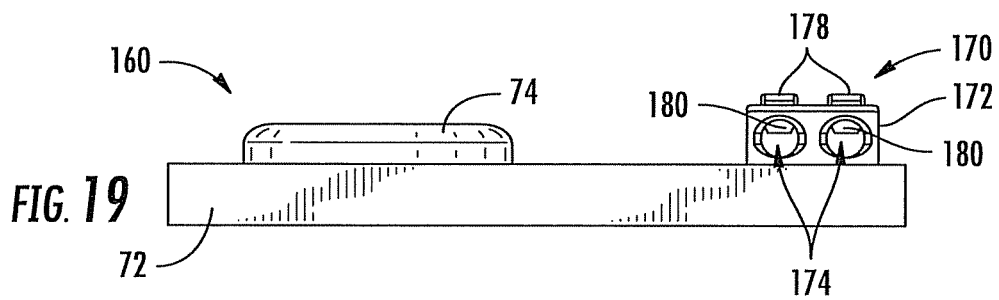
FIG. 19 is a side view of the device in FIG. 18.

Housing 172 can comprise an electrically insulating material, for example, any plastic, ceramic, glass, or polymer-based material such as polyphthalamide (PPA) or nylon. Housing can comprise any size and/or shape, and can be taller or shorter than retention material 74. In one aspect and without limitation, housing 172 can have a height of approximately 4.5 millimeters (mm) and can receive wires 15 ranging in diameter from approximately 14 to 26 gauge (i.e., approximately 0.13 to 2.08 $mm^2$). In one aspect, attachment member 170 can receive wires 15 ranging in diameter from approximately 19 to 19 gauge (i.e., approximately 0.34 to 0.75 $mm^2$). However, wires 15 that are any sub-range smaller in diameter than 0.34 $mm^2$ or larger in diameter than 0.75 $mm^2$ can also be received, for example, ranges from approximately 0.13 to 0.26 $mm^2$; 0.26 to 0.75 $mm^2$; 0.75 to 1 $mm^2$; 1 to 1.5 $mm^2$; and/or 1.5 to 2.08 $mm^2$. In one aspect, housing 172 can comprise any size and any shape adapted to receive any suitable size of electrical wire 15. In one aspect and without limitation, housing 172 can have a footprint of approximately 8 mm×14 mm, however, any size is hereby contemplated. Housing 172 can further comprise one or more tab portions 178 that are movable and/or depressible via pushing or otherwise physically manipulating to releasably receive and hold connecting portions 16 of one or more wires 15. As illustrated by FIG. 19, each opening 174 of member 170 can comprise at least one grip member 180 for physically gripping, clamping, crimping, or otherwise securing connecting portion 16 of wire 15 thereby establishing a gas-tight, solder free connection.

Referring to FIG. 20, openings 174 can be adapted to receive and releasably secure the electrically conductive connecting portion 16 of wire 15. Grip members 180 disposed inside openings 174 can physically grip, clamp, crimp, or otherwise secure the wire 15 within openings 174 of housing 172. The arrow denoted M indicates movement of the wire 15 during insertion and removal. During insertion, wire 15 can be pushed into opening 174 until it is engaged and held secure by grip member 180. To release wire 15, a force F can be applied in the direction indicated by the arrow to depress tab portion 176 thereby releasing or disengaging grip member 180 from connecting portion 16 of wire 15. Wire 15 can then be pulled out of and/or otherwise removed from openings 174 of housing 172. Notably, devices and methods disclosed herein can allow for easy-to-operate and solder free physical and electrical connectivity between external electrical components to device 160. Such devices and methods can advantageously improve ease of operation during installation and removal from lighting fixtures, as well as improve ease of manufacture by eliminating the need for solder technology and materials.

Figure 21:
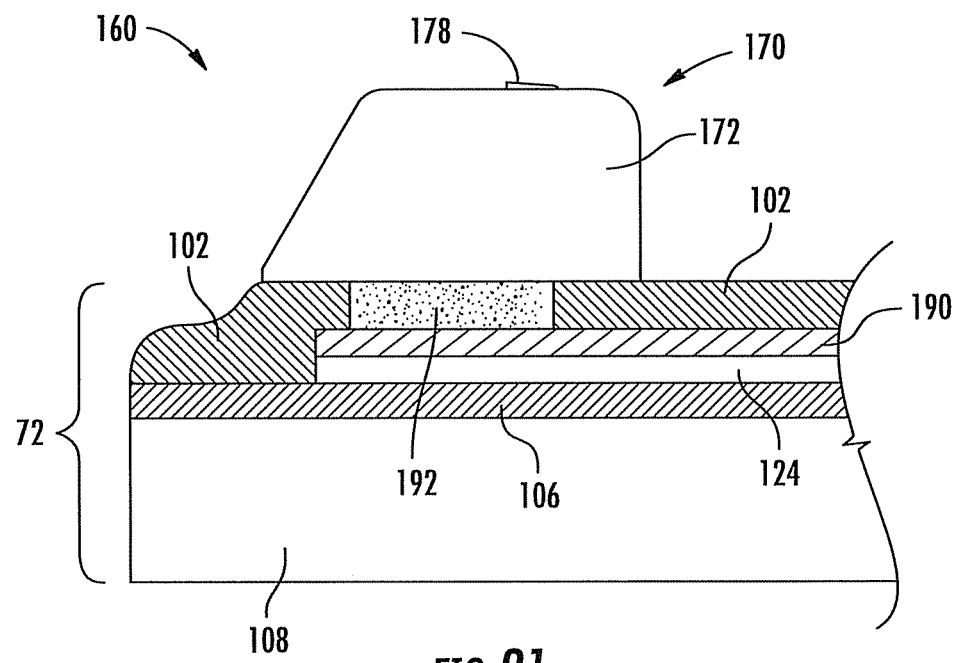
FIG. 21 is a cross-sectional view of the device in FIGS. 18 through 20 showing an attachment member connected to the submount.

Referring to FIG. 21, one embodiment of a physical and electrical connection of attachment member 170 to submount 72 is illustrated. As noted, attachment member 170 can connect to submount 72 via adhesive, electrically conductive tape, solder, or any other suitable connection method. In one aspect, submount comprises a core layer 108 and a dielectric layer 106 disposed over core layer 108. Core layer 108 can comprise a base metal layer such as a layer of Cu or Al. Attachment surface 124 can be at least partially disposed over dielectric layer, where a portion of attachment surface 124 is at least partially exposed between layers of solder mask 102. A second portion of attachment surface 124 can extend below solder mask (e.g., size/shape of material 110, FIG. 11) to electrically communicate with traces 104 and/or 103. In one aspect, attachment surface 124 comprises a layer of Cu. One or more optional intervening layers of material 190 can be disposed over attachment surface 124. Intervening layers of material 190 can comprise one or more layers of metal such as gold (Au), silver (Ag), nickel (Ni), titanium (Ti), palladium (Pd), etc., and can be used to either improve reflectivity of device 160 and/or improve adhesion between solder mask 102 and attachment surface 124.

Solder mask 102 can be applied over attachment surface 124 and intervening layers 190 where such layers are present. Solder mask 102 can be patterned to leave an area of attachment surface 124 and/or layer 190 exposed on a surface of submount 72 for connecting to attachment member 170. In one aspect, attachment member 170 can physically and electrically connect to submount 72 via a soldering process where solder 192 is applied between attachment surface 124 (and/or layer 190 where present) and a bottom surface of attachment member 170. As noted earlier, bottom surface of attachment member 170 can comprise an electrically conductive contact for electrically and physically connecting with submount 72 via solder attachment. Attachment member 170 can comprise a solder free connector adapted to electrically connect to wire 15 (FIG. 20) without the need for solder material and/or a soldering process. The fact that member 170 may be soldered to submount 72 does not affect the solder free connection method established between member 170 and electrical component, (e.g., wire 15, FIG. 20).

Figure 22:
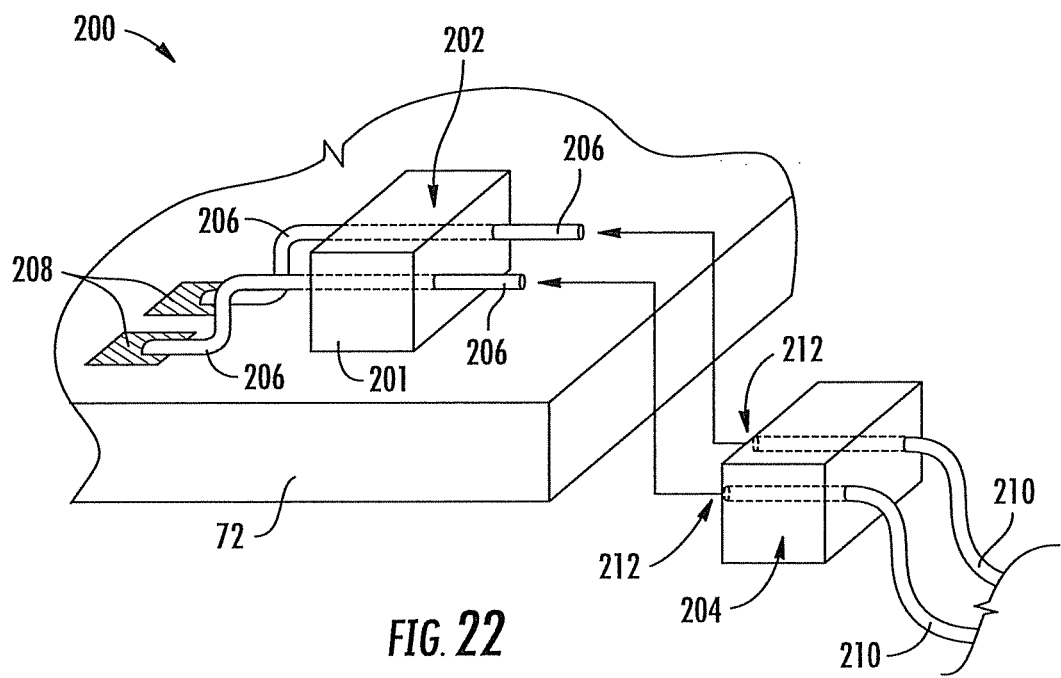
FIG. 22 is a side perspective view of a light emitting device attachment member according to the disclosure herein.

FIG. 22 illustrates a portion of another embodiment of a light emitting device, generally designated 200. Device 200 can be similar in form and function to any of the previously described devices such as device 160, as such, for illustration purposes only a portion of the device is shown. Device can comprise a submount 72 for physically and electrically communicating with an attachment member, generally designated 202. A light emission area 76 (FIG. 18) and a retention material 74 (FIG. 18) can be disposed over submount 72. Attachment member 202 can be configured to electrically and physically communicate with an external electrical component. In one aspect, the external electrical component can comprise an external housing 204 configured with electrical wires for supplying power from an external power source or circuit (not shown).

Attachment member 202 can comprise one or more pins 206, a portion of which are configured to engage external housing 204 and a portion of which can physically and electrically connect to submount 72. Pins 206 can comprise a first portion extending from a housing 201 of attachment member 202. Pins 206 can extend internally through housing 201 of attachment member 202 and comprise a second portion which extends from a side of housing 201 which opposing that from which the first portion extends from. The second portion of pins 206 can be configured to physically and electrically connect to submount 72 via attachment surfaces 208. In one aspect, pins 206 can be soldered to attachment surface 208. Attachment surfaces can be similar in form and function as previously described surfaces 124 (FIGS. 13 and 15A-E). In one aspect, pins 206 comprise connectors that are an electrically conductive material such as a metal, for example, Au plated with one or more layers of Cu, Sn, lead (Pb), and/or Ni. Housing 201 of attachment member 202 can be disposed about pins 206 and can comprise an electrically insulating material, for example, any plastic, ceramic, glass, or polymer-based material such as PPA or nylon.

Attachment member 202 can comprise a solder free connector for releasably engaging an electrical component, such as external housing 204. That is, the connection between member 202 and external housing 204 is not established via solder and/or a soldering process. In one aspect, external housing 204 comprises one or more electrically conductive wires 210. The wires extend through housing and become crimped to form at female pins or terminals 212. The female terminals 212 can frictionally engage pins 206 of member 202 and when pins 206 are inserted into terminals 212 indicated by the arrows. The connection between member 202 and electrical component or external housing 204 can be a frictional connection and/or snap-fit wherein pins 206 releasably engage female terminals 212. Pins 206 can be released from female terminals 212 via pulling apart member 202 from external housing 204, or otherwise ejecting pins. Electrical signal can pass from wires 210 into pins 206 and then into submount 72 of device 200 via attachment surfaces 208. For illustration purposes, two pins 206 and terminals 212 are shown, however, more than two pins 206 and terminals 212 are contemplated. Upon connection of attachment member 202 to external housing 204, two gas-tight connections are established. A first gas-tight connection comprises the wires 210 crimped to form the female terminal 212 and a second gas-tight connection comprises the female terminals 212 connecting to pins 206.

LED devices disclosed herein can also advantageously allow more robust electrical connections while decreasing manufacturing time. For example, because the submount to which external electrical wires or connectors are typically soldered or attached can be thermally conductive and/or heat sinks, it is advantageous to space the attachment portion away from the submount. By locating the attachment portion a distance away from the thermally conductive submount, soldering or attaching processes can become more efficient as heat will not be drawn away from the attachment portion as quickly as in instances where the attachment portion is not raised above the submount. The soldering or attachment process can be carried out more quickly and can result in a more reliable solder connection with better wetting to essential surfaces because the heat is not easily drawn away. The steady flow of heat above the submount can then more readily bond the wire to the attachment portion and create a bond having fewer defects and/or voids due to improper melting and wetting to the components during the attachment process. Attachment members that form gas-tight, solder free connections are also more robust, as solder is not used, and there is no risk of breakage off of the wire at the solder joint, thereby cutting off the flow of electric current to the devices described herein. By making solder obsolete when connecting electrical components (e.g., wires) to attachment members disclosed herein, manufacturing and/or installation time and costs can also be saved.

Embodiments of the present disclosure shown in the drawings and described above are exemplary of numerous embodiments that can be made within the scope of the appended claims. It is contemplated that the configurations of LED devices and methods of making the same can comprise numerous configurations other than those specifically disclosed.

What is claimed is:
1. A light emitting device comprising:
a submount;
a light emission area comprising a plurality of light emitting diode (LED) chips, disposed over the submount; and
at least one attachment member provided on the submount for engaging an electrical component and providing a solder free connection between the electrical component and the attachment member, wherein the attachment member is configured to displace a portion of the elec- trical component, and wherein each LED chip and the attachment member are disposed on a same surface of the submount.

2. The light emitting device of claim 1, wherein the attachment member comprises an insulated housing and one or more openings within the housing for receiving the electrical component.

3. The light emitting device of claim 2, wherein the openings comprise a grip member for physically securing the electrical component within the attachment member.

4. The light emitting device of claim 3, wherein electrical component comprises an electrical wire with a diameter ranging from 0.13 to 2.08 square millimeters ($mm^2$).

5. The light emitting device of claim 1, wherein electrical component comprises an electrical wire with a diameter ranging from 0.13 to 2.08 square millimeters ($mm^2$).

6. The light emitting device of claim 1, wherein the plurality of LED chips is disposed under a filling material.

7. The light emitting device of claim 1, wherein a retention material is provided about the light emission area.

8. The light emitting device of claim 7, wherein the retention material is dispensed about the light emission area.

9. The light emitting device of claim 1, wherein the attachment member is adapted to physically and electrically connect the electrical component to the submount.

10. The device of claim 1, wherein the attachment member comprises an insulation displacement connector (IDC) having at least one set of blade portions for electrically communicating with electrical component.

11. The device of claim 10, wherein the IDC comprises a double contact connector having more than one set of blade portions.

12. The device of claim 1, wherein the attachment member comprises an insulated housing with one or more pins extending from housing.

13. The device of claim 12, wherein the pins are configured to physically and electrically connect to a female terminal of electrical component thereby providing the solder free connection.

14. The device of claim 1, wherein the attachment member physically and electrically connects to submount via solder, adhesive, or electrically conductive tape.

15. The device of claim 1, wherein the attachment member comprises a first channel for crimping about a bare portion of electrical component.

16. The device of claim 15, wherein the attachment member comprises a second channel for crimping about an insulated portion of electrical component.

17. A method of providing external electrical current to a light emitting device, the method comprising:
providing the light emitting device, the device comprising:
a submount;
a light emission area comprising a plurality of light emitting diode (LED) chips disposed over the submount; and
at least one attachment member on the submount, wherein the attachment member releasably engages an electrical component thereby providing a solder free connection between the attachment member and the electrical component, wherein each LED chip and the attachment member are disposed on a same surface of the submount;
positioning the electrical component into the attachment member of the device; and
displacing a portion of the electrical component to physically and electrically connect the electrical component to the device.

18. The method of claim 17, wherein attaching the electrical component comprises inserting the electrical component into an opening of a housing of the attachment member to physically and electrically connect the electrical component to the device.

19. The method of claim 17, further comprising releasing the electrical component from the attachment member to physically and electrically disconnect the electrical component from the device.

20. The method of claim 19, wherein releasing the electrical component comprises depressing a tab of the attachment member to physically and electrically disengage the electrical component from the attachment member.

21. The method of claim 17, wherein attaching the electrical component comprises positioning the electrical component between at least one set of blade portions of an insulation displacement connector (IDC).

22. The method of claim 21, wherein attaching the electrical component comprises positioning the electrical component between at least two set of blade portions of the IDC.

23. The method of claim 17, wherein attaching the electrical component comprises inserting one or more pins extending from a housing of the attachment member into a female terminal of an external housing.

24. The method of claim 23, wherein the pins are configured to physically and electrically connect to the female terminal of electrical component.

25. The method of claim 17, further comprising electrically and physically connecting the attachment member to the submount via soldering.

26. The method of claim 17, wherein attaching the electrical component comprises crimping a bare portion of the electrical component in a first channel.

27. The device of claim 26, wherein attaching the electrical component further comprises crimping an insulated portion of the electrical component in a second channel.

28. A light emitting device comprising:
a submount;
a plurality of light emitting diode (LED) chips disposed on the submount; and
at least one attachment member attached to the submount, the attachment member comprising a housing for receiving and displacing a portion of an electrical connector and for maintaining the electrical connector a distance spaced apart from the submount, wherein each LED chip and the attachment member are disposed on a same surface of the submount.

29. The light emitting device of claim 28, wherein the plurality of LED chips is at least partially disposed under a filling material.

30. The light emitting device of claim 28, further comprising a retention material disposed about at least a portion of the plurality of LED chips.

31. The light emitting device of claim 30, wherein the retention material comprises a dispensed retention material on the submount.

32. The light emitting device of claim 29, wherein the filling material comprises an encapsulant having at least one phosphor.

33. The light emitting device of claim 28, wherein the attachment member comprises a central body portion disposed between one or more raised portions.

34. The light emitting device of claim 33, wherein the one or more raised portions comprise an attachment portion spaced apart the distance from the submount for electrically connecting to at least a portion of an electrical wire.

35. The light emitting device of claim 33, wherein the central body portion comprises an attachment portion spaced apart the distance from the submount for electrically connecting to at least a portion of an electrical wire.

36. The light emitting device of claim 28, wherein the distance the attachment member is spaced apart from the submount is greater than 0 millimeters (mm) from the submount.

37. The light emitting device of claim 28, wherein the distance the attachment member is spaced apart from the submount is less than a height of a retention material disposed about at least a portion of the light emission area.

38. The light emitting device of claim 28, further comprising insulating wire guides for preventing electrical component from shorting or electrically arcing.

39. The light emitting device of claim 28, wherein the electrical connector is crimped between upper body portions of the attachment member.

40. The light emitting device of claim 39, wherein a plastic housing is disposed about the area where the wire is crimped.

41. A light emitting device comprising:
a submount;
at least one electrical trace disposed over the submount;
an array of light emitting diode (LED) chips electrically connected to the at least one electrical trace; and
at least one attachment member soldered to the submount, the attachment member comprising a housing for receiving an electrical connector and maintaining the electrical connector at least a distance above an upper surface of the submount, wherein each LED chip and the attachment member are disposed on the upper surface of the submount.

42. The light emitting device of claim 41, further comprising a retention material at least partially disposed about the array of LED chips.

43. The light emitting device of claim 42, wherein the retention material is adapted for retaining a fill material for covering the LED chips.

44. The light emitting device of claim 43, wherein the fill material at least partially comprises a phosphor or other material for affecting light color from light emitted from the LED chips.

45. The light emitting device of claim 42, wherein the retention material is disposed over at least a portion of the at least one electrical trace.

46. The light emitting device of claim 42, wherein the retention material is disposed over at least a portion of the at least one electrical trace to which at least one of the LED chips is connected.

47. The light emitting device of claim 41, wherein the attachment member comprises at least one attachment portion spaced apart the distance from the submount.

48. The light emitting device of claim 47, wherein the attachment portion is disposed at least partially along a central body portion.

49. The light emitting device of claim 48, wherein the attachment portion is disposed at least partially along at least one raised portion of the attachment member.

50. The light emitting device of claim 47, wherein an electrically conductive wire is positioned and attached at least partially over the at least one attachment portion.

51. The light emitting device of claim 41, wherein the distance the attachment member is spaced apart from the submount is greater than 0 millimeters (mm) from the submount.

52. The light emitting device of claim 41, wherein the electrical connector is crimped between upper body portions of the attachment member.

53. The light emitting device of claim 52, wherein a plastic housing is disposed about the area where the wire is crimped.

54. A method for fabricating a light emitting device, the method comprising:
providing a submount comprising one or more light emitting diode (LED) chips disposed over the submount, the submount comprising an attachment member soldered thereto and in electrical communication with the one or more LEDs; and
positioning an external electrical component in the attachment member for displacing a portion of the electrical component thereby electrically connecting the one or more LED chips and the electrical component, such that the electrical component is maintained at least a distance above an upper surface of the submount, wherein each LED chip and the attachment member are disposed on the upper surface of the submount.

55. The method of claim 54, wherein electrically connecting the attachment member to the external electrical component comprises soldering the electrical component to the attachment member.

56. The method of claim 55, wherein soldering the electrical component to the attachment member comprises soldering the electrical component at the distance greater than 0 mm spaced apart from the submount.

57. The method of claim 54, wherein electrically connecting the attachment member to the external electrical component comprises receiving the external electrical component into an opening of the attachment member.

58. The method of claim 54, wherein electrically connecting the attachment member to the external electrical component comprises positioning the external electrical component within a set of blades disposed on the attachment member.

59. The method of claim 54, wherein electrically connecting the attachment member to the external electrical component comprises inserting pins of the attachment member into a female terminal disposed on the electrical component.

60. The method of claim 54, wherein providing a submount comprises providing a submount with a retention material dispensed on the submount, the retention material at least partially dispensed about the one or more LEDs.

61. The method of claim 60, further comprising providing a fill material at least partially over the one or more LEDs, wherein the fill material is retained in place at least partially by the retention material.

62. The method of claim 54, wherein electrically connecting the attachment member comprises crimping the external electrical component between upper body portions of the attachment member.

63. A light emitting device comprising:
a device surface;
at least one light emitter chip disposed on the device surface; and
a wire attachment surface disposed on the same device surface as the at least one light emitter chip and in electrical communication with the at least one light emitter chip, wherein the wire attachment surface is spaced apart from the device surface and receives a wire, and wherein the wire is retained by a portion of the wire attachment surface thereby electrically coupling the wire to the device.

64. The device of claim 63, wherein the attachment member comprises a reduced area portion relative to a pad portion of the wire attachment surface directly on the device surface.

65. The device of claim 63, wherein the reduced area portion is adapted to reduce the thermal conductivity of the attachment member relative to the pad portion.

66. The device of claim 63, wherein the attachment member comprises a reduced thermal conductivity portion relative to the pad portion.

67. The device of claim 63, where the wire attachment surface comprises one or more blades configured to displace a cover portion of the wire.

68. The device of claim 63, wherein the attachment member is adapted to retain the wire prior to bonding.

69. A light emitting device comprising:
  a device surface;
  at least one light emitter chip disposed on the device surface; and
  a wire attachment surface disposed on the same device surface as the at least one light emitter chip and in electrical communication to the at least one light emitter chip, wherein the wire attachment surface comprises a first surface adapted to receive and retain a wire for solder free bonding thereto, and a second surface opposing the first surface, wherein the second surface is electrically coupled to the device, and wherein the attachment surface provides an electrical connection between the wire and the device.

* * * * *